United States Patent
Sasagawa et al.

(10) Patent No.: US 7,564,613 B2
(45) Date of Patent: Jul. 21, 2009

(54) MICROELECTROMECHANICAL DEVICE AND METHOD UTILIZING A POROUS SURFACE

(75) Inventors: Teruo Sasagawa, Los Gatos, CA (US); Lior Kogut, Sunnyvale, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 11/869,467

(22) Filed: Oct. 9, 2007

(65) Prior Publication Data

US 2008/0030825 A1 Feb. 7, 2008

Related U.S. Application Data

(63) Continuation of application No. 11/407,470, filed on Apr. 19, 2006, now Pat. No. 7,417,784.

(51) Int. Cl.
G02B 26/00 (2006.01)

(52) U.S. Cl. ........................................ 359/290; 359/291

(58) Field of Classification Search .............. 359/290, 359/291, 292, 245, 247, 248, 250, 295, 577, 359/578, 580, 581, 582, 584, 585
See application file for complete search history.

(56) References Cited

U.S. PATENT DOCUMENTS

| | | | |
|---|---|---|---|
| 2,534,846 A | 12/1950 | Ambrose et al. |
| 3,439,973 A | 4/1969 | Paul et al. |
| 3,443,854 A | 5/1969 | Weiss |
| 3,616,312 A | 10/1971 | McGriff et al. |
| 3,653,741 A | 4/1972 | Marks |
| 3,656,836 A | 4/1972 | de Cremoux et al. |
| 3,725,868 A | 4/1973 | Malmer, Jr. et al. |
| 3,728,030 A | 4/1973 | Hawes |
| 3,813,265 A | 5/1974 | Marks |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |

(Continued)

FOREIGN PATENT DOCUMENTS

CH 680534 9/1992

(Continued)

OTHER PUBLICATIONS

Akasaka, "Three-Dimensional IC Trends," Proceedings of IEEE, vol. 74, No. 12, pp. 1703-1714, (Dec. 1986).

(Continued)

*Primary Examiner*—Tuyen Q Tra
(74) *Attorney, Agent, or Firm*—Knobbe Martens Olson & Bear LLP

(57) ABSTRACT

A microelectromechanical device (MEMS) utilizing a porous electrode surface for reducing stiction is disclosed. In one embodiment, a microelectromechanical device is an interferometric modulator that includes a transparent electrode having a first surface; and a movable reflective electrode with a second surface facing the first surface. The movable reflective electrode is movable between a relaxed and actuated (collapsed) position. An aluminum layer is provided on either the first or second surface. The aluminum layer is then anodized to provide an aluminum oxide layer which has a porous surface. The porous surface, in the actuated position, decreases contact area between the electrodes, thus reducing stiction.

35 Claims, 15 Drawing Sheets

U.S. PATENT DOCUMENTS

| | | | |
|---|---|---|---|
| 4,377,324 A | 3/1983 | Durand et al. | |
| 4,389,096 A | 6/1983 | Hori et al. | |
| 4,392,711 A | 7/1983 | Moraw et al. | |
| 4,403,248 A | 9/1983 | te Velde | |
| 4,441,791 A | 4/1984 | Hornbeck | |
| 4,445,050 A | 4/1984 | Marks | |
| 4,459,182 A | 7/1984 | te Velde | |
| 4,482,213 A | 11/1984 | Piliavin et al. | |
| 4,500,171 A | 2/1985 | Penz et al. | |
| 4,519,676 A | 5/1985 | te Velde | |
| 4,531,126 A | 7/1985 | Sadones | |
| 4,566,935 A | 1/1986 | Hornbeck | |
| 4,571,603 A | 2/1986 | Hornbeck et al. | |
| 4,596,992 A | 6/1986 | Hornbeck | |
| 4,615,595 A | 10/1986 | Hornbeck | |
| 4,617,608 A | 10/1986 | Blonder et al. | |
| 4,662,746 A | 5/1987 | Hornbeck | |
| 4,663,083 A | 5/1987 | Marks | |
| 4,681,403 A | 7/1987 | te Velde et al. | |
| 4,710,732 A | 12/1987 | Hornbeck | |
| 4,748,366 A | 5/1988 | Taylor | |
| 4,786,128 A | 11/1988 | Birnbach | |
| 4,790,635 A | 12/1988 | Apsley | |
| 4,856,863 A | 8/1989 | Sampsell et al. | |
| 4,859,060 A | 8/1989 | Katagiri et al. | |
| 4,863,245 A | 9/1989 | Roxlo | |
| 4,900,136 A | 2/1990 | Goldburt et al. | |
| 4,900,395 A | 2/1990 | Syverson et al. | |
| 4,937,496 A | 6/1990 | Neiger et al. | |
| 4,954,789 A | 9/1990 | Sampsell | |
| 4,956,619 A | 9/1990 | Hornbeck | |
| 4,965,562 A | 10/1990 | Verhulst | |
| 4,982,184 A | 1/1991 | Kirkwood | |
| 5,018,256 A | 5/1991 | Hornbeck | |
| 5,022,745 A | 6/1991 | Zayhowski et al. | |
| 5,028,939 A | 7/1991 | Hornbeck et al. | |
| 5,037,173 A | 8/1991 | Sampsell et al. | |
| 5,044,736 A | 9/1991 | Jaskie et al. | |
| 5,061,049 A | 10/1991 | Hornbeck | |
| 5,075,796 A | 12/1991 | Schildkraut et al. | |
| 5,078,479 A | 1/1992 | Vuilleumier | |
| 5,079,544 A | 1/1992 | DeMond et al. | |
| 5,083,857 A | 1/1992 | Hornbeck | |
| 5,096,279 A | 3/1992 | Hornbeck et al. | |
| 5,099,353 A | 3/1992 | Hornbeck | |
| 5,124,834 A | 6/1992 | Cusano et al. | |
| 5,136,669 A | 8/1992 | Gerdt | |
| 5,142,405 A | 8/1992 | Hornbeck | |
| 5,142,414 A | 8/1992 | Koehler | |
| 5,153,771 A | 10/1992 | Link et al. | |
| 5,162,787 A | 11/1992 | Thompson et al. | |
| 5,168,406 A | 12/1992 | Nelson | |
| 5,170,156 A | 12/1992 | DeMond et al. | |
| 5,172,262 A | 12/1992 | Hornbeck | |
| 5,179,274 A | 1/1993 | Sampsell | |
| 5,192,395 A | 3/1993 | Boysel et al. | |
| 5,192,946 A | 3/1993 | Thompson et al. | |
| 5,206,629 A | 4/1993 | DeMond et al. | |
| 5,212,582 A | 5/1993 | Nelson | |
| 5,214,419 A | 5/1993 | DeMond et al. | |
| 5,214,420 A | 5/1993 | Thompson et al. | |
| 5,216,537 A | 6/1993 | Hornbeck | |
| 5,218,472 A * | 6/1993 | Jozefowicz et al. | 359/584 |
| 5,226,099 A | 7/1993 | Mignardi et al. | |
| 5,228,013 A | 7/1993 | Bik | |
| 5,231,532 A | 7/1993 | Magel et al. | |
| 5,233,385 A | 8/1993 | Sampsell | |
| 5,233,456 A | 8/1993 | Nelson | |
| 5,233,459 A | 8/1993 | Bozler et al. | |
| 5,254,980 A | 10/1993 | Hendrix et al. | |
| 5,272,473 A | 12/1993 | Thompson et al. | |
| 5,278,652 A | 1/1994 | Urbanus et al. | |
| 5,280,277 A | 1/1994 | Hornbeck | |
| 5,287,096 A | 2/1994 | Thompson et al. | |
| 5,293,272 A | 3/1994 | Jannson et al. | |
| 5,296,950 A | 3/1994 | Lin et al. | |
| 5,299,041 A | 3/1994 | Morin et al. | |
| 5,305,640 A | 4/1994 | Boysel et al. | |
| 5,311,360 A | 5/1994 | Bloom et al. | |
| 5,312,512 A | 5/1994 | Allman et al. | |
| 5,312,513 A | 5/1994 | Florence et al. | |
| 5,323,002 A | 6/1994 | Sampsell et al. | |
| 5,324,683 A | 6/1994 | Fitch et al. | |
| 5,325,116 A | 6/1994 | Sampsell | |
| 5,326,430 A | 7/1994 | Cronin et al. | |
| 5,327,286 A | 7/1994 | Sampsell et al. | |
| 5,330,617 A | 7/1994 | Haond | |
| 5,331,454 A | 7/1994 | Hornbeck | |
| 5,339,116 A | 8/1994 | Urbanus et al. | |
| 5,345,328 A | 9/1994 | Fritz et al. | |
| 5,347,377 A | 9/1994 | Revelli, Jr. et al. | |
| 5,355,357 A | 10/1994 | Yamamori et al. | |
| 5,358,601 A | 10/1994 | Cathey | |
| 5,365,283 A | 11/1994 | Doherty et al. | |
| 5,381,232 A | 1/1995 | van Wijk | |
| 5,381,253 A | 1/1995 | Sharp et al. | |
| 5,401,983 A | 3/1995 | Jokerst et al. | |
| 5,411,769 A | 5/1995 | Hornbeck | |
| 5,444,566 A | 8/1995 | Gale et al. | |
| 5,446,479 A | 8/1995 | Thompson et al. | |
| 5,448,314 A | 9/1995 | Heimbuch et al. | |
| 5,452,024 A | 9/1995 | Sampsell | |
| 5,454,906 A | 10/1995 | Baker et al. | |
| 5,457,493 A | 10/1995 | Leddy et al. | |
| 5,457,566 A | 10/1995 | Sampsell et al. | |
| 5,459,602 A | 10/1995 | Sampsell | |
| 5,459,610 A | 10/1995 | Bloom et al. | |
| 5,461,411 A | 10/1995 | Florence et al. | |
| 5,474,865 A | 12/1995 | Vasudev | |
| 5,488,505 A | 1/1996 | Engle | |
| 5,489,952 A | 2/1996 | Gove et al. | |
| 5,497,172 A | 3/1996 | Doherty et al. | |
| 5,497,197 A | 3/1996 | Gove et al. | |
| 5,499,037 A | 3/1996 | Nakagawa et al. | |
| 5,499,062 A | 3/1996 | Urbanus | |
| 5,500,635 A | 3/1996 | Mott | |
| 5,500,761 A | 3/1996 | Goossen et al. | |
| 5,503,952 A | 4/1996 | Suzuki et al. | |
| 5,506,597 A | 4/1996 | Thompson et al. | |
| 5,515,076 A | 5/1996 | Thompson et al. | |
| 5,517,347 A | 5/1996 | Sampsell | |
| 5,523,803 A | 6/1996 | Urbanus et al. | |
| 5,526,051 A | 6/1996 | Gove et al. | |
| 5,526,172 A | 6/1996 | Kanack | |
| 5,526,327 A | 6/1996 | Cordova, Jr. | |
| 5,526,688 A | 6/1996 | Boysel et al. | |
| 5,535,047 A | 7/1996 | Hornbeck | |
| 5,548,301 A | 8/1996 | Kornher et al. | |
| 5,551,293 A | 9/1996 | Boysel et al. | |
| 5,552,924 A | 9/1996 | Tregilgas | |
| 5,552,925 A | 9/1996 | Worley | |
| 5,559,358 A | 9/1996 | Burns et al. | |
| 5,563,398 A | 10/1996 | Sampsell | |
| 5,567,334 A | 10/1996 | Baker et al. | |
| 5,570,135 A | 10/1996 | Gove et al. | |
| 5,578,976 A | 11/1996 | Yao | |
| 5,579,149 A | 11/1996 | Moret et al. | |
| 5,581,272 A | 12/1996 | Conner et al. | |
| 5,583,688 A | 12/1996 | Hornbeck | |
| 5,589,852 A | 12/1996 | Thompson et al. | |
| 5,597,736 A | 1/1997 | Sampsell | |
| 5,600,383 A | 2/1997 | Hornbeck | |
| 5,602,671 A | 2/1997 | Hornbeck | |
| 5,606,441 A | 2/1997 | Florence et al. | |

| | | | | | | |
|---|---|---|---|---|---|---|
| 5,608,468 | A | 3/1997 | Gove et al. | 6,088,162 A | 7/2000 | Someno |
| 5,610,438 | A | 3/1997 | Wallace et al. | 6,097,145 A | 8/2000 | Kastalsky et al. |
| 5,610,624 | A | 3/1997 | Bhuva | 6,099,132 A | 8/2000 | Kaeriyama |
| 5,610,625 | A | 3/1997 | Sampsell | 6,100,477 A | 8/2000 | Randall et al. |
| 5,619,059 | A | 4/1997 | Li et al. | 6,100,872 A | 8/2000 | Aratani et al. |
| 5,619,365 | A | 4/1997 | Rhoades et al. | 6,104,525 A | 8/2000 | Min |
| 5,619,366 | A | 4/1997 | Rhoads et al. | 6,113,239 A | 9/2000 | Sampsell et al. |
| 5,622,814 | A | 4/1997 | Miyata et al. | 6,115,326 A | 9/2000 | Puma et al. |
| 5,629,790 | A | 5/1997 | Neukermans et al. | 6,137,150 A | 10/2000 | Takeuchi et al. |
| 5,633,652 | A | 5/1997 | Kanbe et al. | 6,147,790 A | 11/2000 | Meier et al. |
| 5,636,052 | A | 6/1997 | Arney et al. | 6,158,156 A | 12/2000 | Patrick |
| 5,636,185 | A | 6/1997 | Brewer et al. | 6,160,833 A | 12/2000 | Floyd et al. |
| 5,638,084 | A | 6/1997 | Kalt | 6,166,422 A | 12/2000 | Qian et al. |
| 5,638,946 | A | 6/1997 | Zavracky | 6,170,332 B1 | 1/2001 | MacDonald et al. |
| 5,641,391 | A | 6/1997 | Hunter et al. | 6,171,945 B1 | 1/2001 | Mandal et al. |
| 5,646,768 | A | 7/1997 | Kaeriyama | 6,180,428 B1 | 1/2001 | Peeters et al. |
| 5,647,819 | A | 7/1997 | Fujita et al. | 6,194,323 B1 | 2/2001 | Downey et al. |
| 5,650,834 | A | 7/1997 | Nakagawa et al. | 6,195,196 B1 | 2/2001 | Kimura et al. |
| 5,650,881 | A | 7/1997 | Hornbeck | 6,201,633 B1 | 3/2001 | Peeters et al. |
| 5,654,741 | A | 8/1997 | Sampsell et al. | 6,204,080 B1 | 3/2001 | Hwang |
| 5,657,099 | A | 8/1997 | Doherty et al. | 6,219,015 B1 | 4/2001 | Bloom et al. |
| 5,659,374 | A | 8/1997 | Gale, Jr. et al. | 6,229,683 B1 | 5/2001 | Goodwin-Johansson |
| 5,665,997 | A | 9/1997 | Weaver et al. | 6,232,936 B1 | 5/2001 | Gove et al. |
| 5,673,139 | A | 9/1997 | Johnson | 6,243,149 B1 | 6/2001 | Swanson et al. |
| 5,674,757 | A | 10/1997 | Kim | 6,246,398 B1 | 6/2001 | Koo |
| 5,683,591 | A | 11/1997 | Offenberg | 6,249,039 B1 | 6/2001 | Harvey et al. |
| 5,703,710 | A | 12/1997 | Brinkman et al. | 6,275,220 B1 | 8/2001 | Nitta |
| 5,706,022 | A | 1/1998 | Hato | 6,282,010 B1 | 8/2001 | Sulzbach et al. |
| 5,710,656 | A | 1/1998 | Goossen | 6,284,560 B1 | 9/2001 | Jech et al. |
| 5,726,480 | A | 3/1998 | Pister | 6,288,824 B1 | 9/2001 | Kastalsky |
| 5,737,050 | A | 4/1998 | Takahara et al. | 6,295,154 B1 | 9/2001 | Laor et al. |
| 5,739,945 | A | 4/1998 | Tayebati | 6,323,982 B1 | 11/2001 | Hornbeck |
| 5,745,193 | A | 4/1998 | Urbanus et al. | 6,324,192 B1 | 11/2001 | Tayebati |
| 5,745,281 | A | 4/1998 | Yi et al. | 6,327,071 B1 | 12/2001 | Kimura et al. |
| 5,771,116 | A | 6/1998 | Miller et al. | 6,329,297 B1 | 12/2001 | Balish et al. |
| 5,771,321 | A | 6/1998 | Stern | 6,333,556 B1 | 12/2001 | Juengling et al. |
| 5,784,189 | A | 7/1998 | Bozler et al. | 6,335,831 B2 | 1/2002 | Kowarz et al. |
| 5,784,190 | A | 7/1998 | Worley | 6,340,435 B1 | 1/2002 | Bjorkman et al. |
| 5,784,212 | A | 7/1998 | Hornbeck | 6,351,329 B1 | 2/2002 | Greywall |
| 5,793,504 | A | 8/1998 | Stoll | 6,356,254 B1 | 3/2002 | Kimura |
| 5,808,780 | A | 9/1998 | McDonald | 6,376,787 B1 | 4/2002 | Martin et al. |
| 5,818,095 | A | 10/1998 | Sampsell | 6,391,675 B1 | 5/2002 | Ehmke et al. |
| 5,822,110 | A | 10/1998 | Dabbaj | 6,392,233 B1 | 5/2002 | Channin et al. |
| 5,822,170 | A | 10/1998 | Cabuz et al. | 6,392,781 B1 | 5/2002 | Kim et al. |
| 5,824,608 | A | 10/1998 | Gotoh et al. | 6,407,851 B1 | 6/2002 | Islam et al. |
| 5,825,528 | A | 10/1998 | Goossen | 6,424,094 B1 | 7/2002 | Feldman |
| 5,835,255 | A | 11/1998 | Miles | 6,447,126 B1 | 9/2002 | Hornbeck |
| 5,835,256 | A | 11/1998 | Huibers | 6,449,084 B1 | 9/2002 | Guo |
| 5,838,484 | A | 11/1998 | Goossen et al. | 6,452,124 B1 | 9/2002 | York et al. |
| 5,842,088 | A | 11/1998 | Thompson | 6,452,465 B1 | 9/2002 | Brown et al. |
| 5,867,302 | A | 2/1999 | Fleming et al. | 6,456,420 B1 | 9/2002 | Goodwin-Johansson |
| 5,912,758 | A | 6/1999 | Knipe et al. | 6,465,355 B1 | 10/2002 | Horsley |
| 5,914,803 | A | 6/1999 | Hwang et al. | 6,466,354 B1 | 10/2002 | Gudeman |
| 5,920,421 | A | 7/1999 | Choi | 6,466,358 B2 | 10/2002 | Tew |
| 5,943,155 | A | 8/1999 | Goossen | 6,473,072 B1 | 10/2002 | Comiskey et al. |
| 5,943,158 | A | 8/1999 | Ford et al. | 6,473,274 B1 | 10/2002 | Maimone et al. |
| 5,945,980 | A | 8/1999 | Moissev et al. | 6,480,177 B2 | 11/2002 | Doherty et al. |
| 5,959,763 | A | 9/1999 | Bozler et al. | 6,496,122 B2 | 12/2002 | Sampsell |
| 5,967,163 | A | 10/1999 | Pan et al. | 6,513,911 B1 | 2/2003 | Ozaki et al. |
| 5,972,193 | A | 10/1999 | Chou et al. | 6,522,801 B1 | 2/2003 | Aksyuk et al. |
| 5,976,902 | A | 11/1999 | Shih | 6,531,945 B1 | 3/2003 | Ahn et al. |
| 5,978,127 | A | 11/1999 | Berg | 6,537,427 B1 | 3/2003 | Raina et al. |
| 5,986,796 | A | 11/1999 | Miles | 6,545,335 B1 | 4/2003 | Chua et al. |
| 5,994,174 | A | 11/1999 | Carey et al. | 6,548,908 B2 | 4/2003 | Chua et al. |
| 6,016,693 | A | 1/2000 | Viani et al. | 6,549,195 B2 | 4/2003 | Hikida et al. |
| 6,028,690 | A | 2/2000 | Carter et al. | 6,549,338 B1 | 4/2003 | Wolverton et al. |
| 6,031,653 | A | 2/2000 | Wang | 6,552,840 B2 | 4/2003 | Knipe |
| 6,038,056 | A | 3/2000 | Florence et al. | 6,574,033 B1 | 6/2003 | Chui et al. |
| 6,040,937 | A | 3/2000 | Miles | 6,577,785 B1 | 6/2003 | Spahn et al. |
| 6,049,317 | A | 4/2000 | Thompson et al. | 6,589,625 B1 | 7/2003 | Kothari et al. |
| 6,055,090 | A | 4/2000 | Miles | 6,597,490 B2 | 7/2003 | Tayebati |
| 6,057,903 | A | 5/2000 | Colgan et al. | 6,600,201 B2 | 7/2003 | Hartwell et al. |
| 6,061,075 | A | 5/2000 | Nelson et al. | 6,602,791 B2 | 8/2003 | Ouellet et al. |

| | | |
|---|---|---|
| 6,606,175 B1 | 8/2003 | Sampsell et al. |
| 6,608,268 B1 | 8/2003 | Goldsmith |
| 6,610,440 B1 | 8/2003 | LaFollette et al. |
| 6,624,944 B1 | 9/2003 | Wallace et al. |
| 6,625,047 B2 | 9/2003 | Coleman, Jr. |
| 6,630,786 B2 | 10/2003 | Cummings et al. |
| 6,632,698 B2 | 10/2003 | Ives |
| 6,635,919 B1 | 10/2003 | Melendez et al. |
| 6,639,724 B2 | 10/2003 | Bower et al. |
| 6,642,913 B1 | 11/2003 | Kimura et al. |
| 6,643,069 B2 | 11/2003 | Dewald |
| 6,650,455 B2 | 11/2003 | Miles |
| 6,653,997 B2 | 11/2003 | Van Gorkom et al. |
| 6,657,832 B2 | 12/2003 | Williams et al. |
| 6,660,656 B2 | 12/2003 | Cheung et al. |
| 6,666,561 B1 | 12/2003 | Blakley |
| 6,674,562 B1 | 1/2004 | Miles et al. |
| 6,674,563 B2 | 1/2004 | Chui et al. |
| 6,680,792 B2 | 1/2004 | Miles |
| 6,704,475 B2 | 3/2004 | Jin et al. |
| 6,710,908 B2 | 3/2004 | Miles et al. |
| 6,720,267 B1 | 4/2004 | Chen et al. |
| 6,736,987 B2 | 5/2004 | Cho |
| 6,741,377 B2 | 5/2004 | Miles |
| 6,741,384 B1 | 5/2004 | Martin et al. |
| 6,741,503 B1 | 5/2004 | Farris et al. |
| 6,743,570 B2 | 6/2004 | Harnett et al. |
| 6,747,785 B2 | 6/2004 | Chen et al. |
| 6,747,800 B1 | 6/2004 | Lin |
| 6,756,317 B2 | 6/2004 | Sniegowski et al. |
| 6,760,146 B2 | 7/2004 | Ikeda et al. |
| 6,768,097 B1 | 7/2004 | Vikorovitch et al. |
| 6,775,174 B2 | 8/2004 | Huffman et al. |
| 6,778,155 B2 | 8/2004 | Doherty et al. |
| 6,778,306 B2 | 8/2004 | Sniegowski et al. |
| 6,778,728 B2 | 8/2004 | Taylor et al. |
| 6,791,441 B2 | 9/2004 | Pillans et al. |
| 6,794,119 B2 | 9/2004 | Miles |
| 6,803,534 B1 | 10/2004 | Chen et al. |
| 6,809,788 B2 | 10/2004 | Yamada et al. |
| 6,811,267 B1 | 11/2004 | Allen et al. |
| 6,812,482 B2 | 11/2004 | Fleming et al. |
| 6,819,469 B1 | 11/2004 | Koba |
| 6,822,628 B2 | 11/2004 | Dunphy et al. |
| 6,829,132 B2 | 12/2004 | Martin et al. |
| 6,844,959 B2 | 1/2005 | Huibers et al. |
| 6,853,129 B1 | 2/2005 | Cummings et al. |
| 6,855,610 B2 | 2/2005 | Tung et al. |
| 6,858,080 B2 | 2/2005 | Linares et al. |
| 6,859,218 B1 | 2/2005 | Luman et al. |
| 6,859,301 B1 | 2/2005 | Islam et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,867,896 B2 | 3/2005 | Miles |
| 6,870,581 B2 | 3/2005 | Li et al. |
| 6,870,654 B2 | 3/2005 | Lin et al. |
| 6,881,535 B2 | 4/2005 | Yamaguchi |
| 6,882,458 B2 | 4/2005 | Lin et al. |
| 6,882,461 B1 | 4/2005 | Tsai et al. |
| 6,906,847 B2 | 6/2005 | Huibers et al. |
| 6,912,022 B2 | 6/2005 | Lin et al. |
| 6,940,631 B2 | 9/2005 | Ishikawa |
| 6,947,200 B2 | 9/2005 | Huibers |
| 6,952,303 B2 | 10/2005 | Lin et al. |
| 6,952,304 B2 | 10/2005 | Mushika et al. |
| 6,958,847 B2 | 10/2005 | Lin |
| 6,980,350 B2 | 12/2005 | Hung et al. |
| 6,982,820 B2 | 1/2006 | Tsai |
| 6,987,432 B2 | 1/2006 | Lutz et al. |
| 6,995,890 B2 | 2/2006 | Lin |
| 6,999,225 B2 | 2/2006 | Lin |
| 6,999,236 B2 | 2/2006 | Lin |
| 7,006,272 B2 | 2/2006 | Tsai |
| 7,016,095 B2 | 3/2006 | Lin |
| 7,016,099 B2 | 3/2006 | Ikeda et al. |
| 7,027,202 B1 | 4/2006 | Hunter et al. |
| 7,041,571 B2 | 5/2006 | Strane |
| 7,042,619 B1 | 5/2006 | McGinley et al. |
| 7,042,643 B2 | 5/2006 | Miles et al. |
| 7,078,293 B2 | 7/2006 | Lin et al. |
| 7,119,945 B2 | 10/2006 | Kothari et al. |
| 7,123,216 B1 | 10/2006 | Miles |
| 7,161,730 B2 | 1/2007 | Floyd |
| 7,172,915 B2 | 2/2007 | Lin et al. |
| 7,193,768 B2 | 3/2007 | Lin |
| 7,233,029 B2 | 6/2007 | Mochizuki |
| 7,250,315 B2 | 7/2007 | Miles |
| 7,289,259 B2 | 10/2007 | Chui et al. |
| 7,323,217 B2 | 1/2008 | Lin et al. |
| 7,327,510 B2 | 2/2008 | Cummings et al. |
| 7,369,296 B2 | 5/2008 | Floyd |
| 7,373,026 B2 | 5/2008 | Chui |
| 2001/0003487 A1 | 6/2001 | Miles |
| 2001/0010953 A1 | 8/2001 | Kang et al. |
| 2001/0026951 A1 | 10/2001 | Vergani et al. |
| 2001/0028503 A1 | 10/2001 | Flanders et al. |
| 2001/0040649 A1 | 11/2001 | Ozaki |
| 2001/0040675 A1 | 11/2001 | True et al. |
| 2001/0055208 A1 | 12/2001 | Kimura |
| 2002/0015215 A1 | 2/2002 | Miles |
| 2002/0021485 A1 | 2/2002 | Pilossof |
| 2002/0024711 A1 | 2/2002 | Miles |
| 2002/0031155 A1 | 3/2002 | Tayebati et al. |
| 2002/0036304 A1 | 3/2002 | Ehmke et al. |
| 2002/0054422 A1 | 5/2002 | Carr et al. |
| 2002/0054424 A1 | 5/2002 | Miles |
| 2002/0055253 A1 | 5/2002 | Rudhard |
| 2002/0058422 A1 | 5/2002 | Jang et al. |
| 2002/0070931 A1 | 6/2002 | Ishikawa |
| 2002/0071169 A1 | 6/2002 | Bowers et al. |
| 2002/0075555 A1 | 6/2002 | Miles |
| 2002/0086455 A1 | 7/2002 | Franosch et al. |
| 2002/0109899 A1 | 8/2002 | Ohtaka et al. |
| 2002/0110948 A1 | 8/2002 | Huang et al. |
| 2002/0126364 A1 | 9/2002 | Miles |
| 2002/0131682 A1 | 9/2002 | Nasiri et al. |
| 2002/0135857 A1 | 9/2002 | Fitzpatrick et al. |
| 2002/0137072 A1 | 9/2002 | Mirkin et al. |
| 2002/0141690 A1 | 10/2002 | Jin et al. |
| 2002/0146200 A1 | 10/2002 | Kudric et al. |
| 2002/0149828 A1 | 10/2002 | Miles |
| 2002/0149850 A1 | 10/2002 | Heffner et al. |
| 2002/0167072 A1 | 11/2002 | Andosca |
| 2002/0168136 A1 | 11/2002 | Atia et al. |
| 2002/0171610 A1 | 11/2002 | Siwinski et al. |
| 2002/0186209 A1 | 12/2002 | Cok |
| 2002/0195681 A1 | 12/2002 | Melendez et al. |
| 2003/0006468 A1 | 1/2003 | Ma et al. |
| 2003/0007107 A1 | 1/2003 | Chae |
| 2003/0015936 A1 | 1/2003 | Yoon et al. |
| 2003/0021004 A1 | 1/2003 | Cunningham et al. |
| 2003/0036215 A1 | 2/2003 | Reid |
| 2003/0043157 A1 | 3/2003 | Miles |
| 2003/0053078 A1 | 3/2003 | Missey et al. |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0077843 A1 | 4/2003 | Yamauchi et al. |
| 2003/0090350 A1 | 5/2003 | Feng et al. |
| 2003/0091072 A1 | 5/2003 | Wang et al. |
| 2003/0102771 A1 | 6/2003 | Akiba et al. |
| 2003/0112096 A1 | 6/2003 | Potter |
| 2003/0118920 A1 | 6/2003 | Johnstone et al. |
| 2003/0119221 A1 | 6/2003 | Cunningham et al. |
| 2003/0123126 A1 | 7/2003 | Meyer et al. |

| | | | | | | |
|---|---|---|---|---|---|---|
| 2003/0132822 A1 | 7/2003 | Ko et al. | | 2005/0024557 A1 | 2/2005 | Lin |
| 2003/0138213 A1 | 7/2003 | Jiin et al. | | 2005/0035699 A1 | 2/2005 | Tsai |
| 2003/0152872 A1 | 8/2003 | Miles | | 2005/0036095 A1 | 2/2005 | Yeh et al. |
| 2003/0164350 A1 | 9/2003 | Hanson et al. | | 2005/0036192 A1 | 2/2005 | Lin et al. |
| 2003/0201784 A1 | 10/2003 | Potter | | 2005/0038950 A1 | 2/2005 | Adelmann |
| 2003/0202264 A1 | 10/2003 | Weber et al. | | 2005/0042117 A1 | 2/2005 | Lin |
| 2003/0202265 A1 | 10/2003 | Reboa et al. | | 2005/0046919 A1 | 3/2005 | Taguchi et al. |
| 2003/0202266 A1 | 10/2003 | Ring et al. | | 2005/0046922 A1 | 3/2005 | Lin et al. |
| 2003/0205479 A1 * | 11/2003 | Lin et al. ................... 205/153 | | 2005/0046948 A1 | 3/2005 | Lin |
| 2003/0231373 A1 | 12/2003 | Kowarz et al. | | 2005/0057442 A1 | 3/2005 | Way |
| 2004/0008396 A1 | 1/2004 | Stappaerts | | 2005/0068583 A1 | 3/2005 | Gutkowski et al. |
| 2004/0010115 A1 | 1/2004 | Sotzing | | 2005/0068605 A1 | 3/2005 | Tsai |
| 2004/0021085 A1 * | 2/2004 | Prince et al. ................ 250/372 | | 2005/0068606 A1 | 3/2005 | Tsai |
| 2004/0027636 A1 | 2/2004 | Miles | | 2005/0069209 A1 | 3/2005 | Damera-Venkata et al. |
| 2004/0027701 A1 | 2/2004 | Ishikawa | | 2005/0078348 A1 | 4/2005 | Lin |
| 2004/0028849 A1 | 2/2004 | Stark et al. | | 2005/0098840 A1 | 5/2005 | Fuertsch et al. |
| 2004/0035821 A1 | 2/2004 | Doan et al. | | 2005/0128565 A1 | 6/2005 | Ljungblad |
| 2004/0051929 A1 | 3/2004 | Sampsell et al. | | 2005/0168849 A1 | 8/2005 | Lin |
| 2004/0053434 A1 | 3/2004 | Bruner | | 2005/0195462 A1 | 9/2005 | Lin |
| 2004/0056742 A1 | 3/2004 | Dabbaj | | 2005/0195467 A1 | 9/2005 | Kothari et al. |
| 2004/0058531 A1 | 3/2004 | Miles et al. | | 2005/0202649 A1 | 9/2005 | Hung et al. |
| 2004/0058532 A1 | 3/2004 | Miles et al. | | 2005/0249966 A1 | 11/2005 | Tung et al. |
| 2004/0061543 A1 | 4/2004 | Nam et al. | | 2005/0250235 A1 | 11/2005 | Miles et al. |
| 2004/0063322 A1 | 4/2004 | Yang | | 2005/0253820 A1 | 11/2005 | Horiuchi |
| 2004/0070813 A1 | 4/2004 | Aubuchon | | 2006/0006138 A1 | 1/2006 | Lin |
| 2004/0080035 A1 | 4/2004 | Delapierre | | 2006/0018348 A1 | 1/2006 | Przybyla et al. |
| 2004/0080807 A1 | 4/2004 | Chen et al. | | 2006/0024620 A1 | 2/2006 | Nikkel et al. |
| 2004/0087086 A1 | 5/2004 | Lee | | 2006/0024880 A1 * | 2/2006 | Chui et al. .................. 438/222 |
| 2004/0100594 A1 | 5/2004 | Huibers et al. | | 2006/0056001 A1 | 3/2006 | Taguchi et al. |
| 2004/0100677 A1 | 5/2004 | Huibers et al. | | 2006/0066511 A1 | 3/2006 | Chui |
| 2004/0100680 A1 | 5/2004 | Huibers et al. | | 2006/0066932 A1 | 3/2006 | Chui |
| 2004/0124073 A1 | 7/2004 | Pilans et al. | | 2006/0067646 A1 | 3/2006 | Chui |
| 2004/0125281 A1 | 7/2004 | Lin et al. | | 2006/0077518 A1 | 4/2006 | Chui et al. |
| 2004/0125282 A1 | 7/2004 | Lin et al. | | 2006/0077528 A1 | 4/2006 | Floyd |
| 2004/0125536 A1 | 7/2004 | Arney et al. | | 2006/0209386 A1 * | 9/2006 | Sudak et al. ................ 359/291 |
| 2004/0136045 A1 | 7/2004 | Tran | | 2006/0261330 A1 | 11/2006 | Miles |
| 2004/0136076 A1 | 7/2004 | Parviz | | 2007/0019280 A1 | 1/2007 | Sasagawa et al. |
| 2004/0145049 A1 | 7/2004 | McKinnell et al. | | 2007/0041703 A1 | 2/2007 | Wang |
| 2004/0145811 A1 | 7/2004 | Lin et al. | | 2007/0096300 A1 | 5/2007 | Wang et al. |
| 2004/0147056 A1 | 7/2004 | McKinnell et al. | | 2007/0103028 A1 | 5/2007 | Lewis et al. |
| 2004/0147198 A1 | 7/2004 | Lin et al. | | 2007/0121205 A1 | 5/2007 | Miles |
| 2004/0148009 A1 | 7/2004 | Buzzard | | 2007/0155051 A1 | 7/2007 | Wang et al. |
| 2004/0150869 A1 | 8/2004 | Kasai | | 2007/0170540 A1 | 7/2007 | Chung et al. |
| 2004/0150939 A1 | 8/2004 | Huff | | 2007/0206267 A1 | 9/2007 | Tung et al. |
| 2004/0160143 A1 | 8/2004 | Shreeve et al. | | 2007/0236774 A1 | 10/2007 | Gousev et al. |
| 2004/0174583 A1 | 9/2004 | Chen et al. | | 2007/0247401 A1 | 10/2007 | Sasagawa et al. |
| 2004/0175577 A1 | 9/2004 | Lin et al. | | 2007/0249078 A1 | 10/2007 | Tung et al. |
| 2004/0179281 A1 | 9/2004 | Reboa | | 2007/0249079 A1 | 10/2007 | Sasagawa et al. |
| 2004/0179445 A1 | 9/2004 | Park | | 2007/0285761 A1 | 12/2007 | Zhong et al. |
| 2004/0191937 A1 | 9/2004 | Patel et al. | | 2008/0026328 A1 | 1/2008 | Miles |
| 2004/0201908 A1 | 10/2004 | Kaneko | | 2008/0093688 A1 | 4/2008 | Cummings et al. |
| 2004/0207497 A1 | 10/2004 | Hsu et al. | | 2008/0144163 A1 | 6/2008 | Floyd |
| 2004/0207897 A1 | 10/2004 | Lin | | 2008/0226929 A1 | 9/2008 | Chung et al. |
| 2004/0209192 A1 | 10/2004 | Lin et al. | | | | |
| 2004/0209195 A1 | 10/2004 | Lin | | | FOREIGN PATENT DOCUMENTS | |
| 2004/0212026 A1 | 10/2004 | Van Brocklin et al. | | | | |
| 2004/0217378 A1 | 11/2004 | Martin et al. | | CH | 681 047 | 12/1992 |
| 2004/0217919 A1 | 11/2004 | Pichl et al. | | CN | 092109265 | 11/2003 |
| 2004/0218251 A1 | 11/2004 | Piehl et al. | | DE | 10228946 A1 | 1/2004 |
| 2004/0218334 A1 | 11/2004 | Martin et al. | | DE | 103 25 334 A1 | 1/2005 |
| 2004/0218341 A1 | 11/2004 | Martin et al. | | EP | 0 035 299 | 9/1983 |
| 2004/0226909 A1 | 11/2004 | Tzeng | | EP | 0173808 | 3/1986 |
| 2004/0227493 A1 | 11/2004 | Van Brocklin et al. | | EP | 0 667 548 A1 | 8/1995 |
| 2004/0240027 A1 | 12/2004 | Lin et al. | | EP | 0694801 A | 1/1996 |
| 2004/0240032 A1 | 12/2004 | Miles | | EP | 0695959 | 2/1996 |
| 2004/0240138 A1 | 12/2004 | Martin et al. | | EP | 0878824 A2 | 11/1998 |
| 2004/0245588 A1 | 12/2004 | Nikkel et al. | | EP | 1 088 785 A1 | 4/2001 |
| 2004/0263944 A1 | 12/2004 | Miles et al. | | EP | 1 170 618 | 1/2002 |
| 2005/0001828 A1 | 1/2005 | Martin et al. | | EP | 1197778 | 4/2002 |
| 2005/0003667 A1 | 1/2005 | Lin et al. | | EP | 1 243 550 | 9/2002 |
| 2005/0012577 A1 | 1/2005 | Pillans et al. | | EP | 1258860 A1 | 11/2002 |
| 2005/0012975 A1 | 1/2005 | George et al. | | EP | 1 452 481 A | 9/2004 |
| 2005/0020089 A1 | 1/2005 | Shi et al. | | EP | 1 484 635 | 12/2004 |

| | | |
|---|---|---|
| EP | 1 640 772 | 3/2006 |
| FR | 2824643 | 10/1999 |
| JP | 405275401 A | 10/1993 |
| JP | 06-281956 | 10/1994 |
| JP | 06301054 | 10/1994 |
| JP | 07-45550 | 2/1995 |
| JP | 08293580 | 11/1996 |
| JP | 09-036387 | 2/1997 |
| JP | 10500224 | 1/1998 |
| JP | 10-116996 | 5/1998 |
| JP | 10-148644 | 6/1998 |
| JP | 10-267658 | 10/1998 |
| JP | 11211999 A | 8/1999 |
| JP | 11-263012 | 9/1999 |
| JP | 11243214 | 9/1999 |
| JP | 2000-40831 A | 2/2000 |
| JP | 2002 062493 | 2/2002 |
| JP | 2002-270575 | 9/2002 |
| JP | 2002-277771 | 9/2002 |
| JP | 2002-296521 | 10/2002 |
| JP | 2002-341267 | 11/2002 |
| JP | 2002-355800 | 12/2002 |
| JP | 2003-021798 | 1/2003 |
| JP | 2003001598 A | 1/2003 |
| JP | 2003-057571 | 2/2003 |
| JP | 2003-215475 | 7/2003 |
| JP | 2003195201 | 7/2003 |
| JP | 2004-102022 A | 4/2004 |
| JP | 2004106074 A | 4/2004 |
| JP | 2004157527 | 6/2004 |
| JP | 2004-212656 | 7/2004 |
| JP | 2005051007 A | 2/2005 |
| KR | 2002-9270 | 10/1999 |
| KR | 2000-0033006 | 6/2000 |
| TW | 157313 | 5/1991 |
| WO | WO 92/10925 | 6/1992 |
| WO | WO9530924 | 11/1995 |
| WO | WO9717628 | 5/1997 |
| WO | WO 99/34484 | 7/1999 |
| WO | WO9952006 A3 | 10/1999 |
| WO | WO99502006 A2 | 10/1999 |
| WO | WO0114248 | 3/2001 |
| WO | WO 02/24570 | 3/2002 |
| WO | WO 02/38491 A1 | 5/2002 |
| WO | WO 02/079853 | 10/2002 |
| WO | WO03007049 A1 | 1/2003 |
| WO | WO 03/046508 | 6/2003 |
| WO | WO 03/052506 | 6/2003 |
| WO | WO 03/069413 A | 8/2003 |
| WO | WO03069413 A1 | 8/2003 |
| WO | WO03073151 A1 | 9/2003 |
| WO | WO 2004/000717 A2 | 12/2003 |
| WO | WO2004006003 A1 | 1/2004 |
| WO | WO 2004/015741 | 2/2004 |
| WO | WO2004026757 A2 | 4/2004 |
| WO | WO 2005/006364 | 1/2005 |
| WO | WO 2005/019899 A1 | 3/2005 |
| WO | WO 2005/066596 | 7/2005 |
| WO | WO 2005/085932 A | 9/2005 |
| WO | WO 2005/124869 | 12/2005 |
| WO | WO 2006/036385 | 4/2006 |
| WO | WO 2006/036437 | 4/2006 |
| WO | WO 2006/036542 | 4/2006 |

OTHER PUBLICATIONS

Aratani et al., "Surface micromachined tuneable interferometer array," Sensors and Actuators, pp. 17-23. (1994).
Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Austrian Search Report dated Aug. 12, 2005.
Austrian Search Report dated May 4, 2005.
Austrian Search Report for EX139/2005 dated Jul. 27, 2005.
Austrian Search Report for EX144/2005 dated Aug. 11, 2005.
Austrian Search Report for EX170/2005 dated Jul. 6, 2005.
Austrian Search Report for EX72/2005 dated May 13, 2005.
Austrian Search Report for EX81/2005 dated May 18, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Conner, "Hybrid Color Display Using Optical Interference Filter Array," SID Digest, pp. 577-580 (1993).
Crouse, "Self-ordered pore structure of anodized aluminum on silicon and pattern transfer" Applied Physics Letters, vol. 76, No. 1, Jan. 3, 2000. pp. 49-51.
EP 05255661.0 European Search Report (Dec. 30, 2005).
Fan et al., "Channel Drop Filters in Photonic Crystals," Optics Express, vol. 3, No. 1 (1998).
French, P.J. "Development of Surface Micromachining techniques compatible with on-chip electronics" Journal of Micromechanics and Microengineering vol. 6 No. 2, 197-211 XP 002360789 Jun. (1996) IOP Publishing.
Furneaux, et al. "The Formation of Controlled-porosity membranes from Anodically Oxidized Aluminum" Nature vol. 337 Jan. 12, 1989, pp. 147-149.
Giles et al., "A Silicon MEMS Optical Switch Attenuator and Its Use in Lightwave Subsystems," IEEE Journal of Selected Topics in Quantum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K.W., "Mems-Based Variable Optical Interference Devices", Optical Mems, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-deploymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573. (date unknown).
Jerman et al., "A Miniature Fabry-Perot Interferometer with a Corrugated Silicon Diaphragm Support," (1988).
Jerman J. H. et al., "Miniature Fabry-Perot Interferometers Micromachined in Silicon For Use in Optical Fiber Wdm Systems," Transducers. San Francisco, Jun. 24-27, 1991, Proceedings of the International Conference on Solid State Sensors And actuators, New York IEEE, US, vol. Conf. 6, Jun. 24, 1991.
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).

Lee et al., "Electrostatic Actuation Of Surface/Bulk Micromachined Single-Crystal Silicon Microresonators", International Conference on Intelligent Robots and Systems, vol. 2, pp. 1057-1062, (Oct. 17-21, 1999).
Lee et al., "Surface/Bulk Micromachining (Sbm) Process: A New Method For Fabricating Released Mems in Single Crystal Silicon", Journal of Microelectromechanical Systems, vol. 8, Issue 4, pp. 409-416, (Dec. 1999).
Lieberman, "MEMS Display Looks to Give PDAs Sharper Image," EE Times (Feb. 11, 1997).
Lieberman, "Microbridges at Heart of New MEMS Displays," EE Times (Apr. 24, 1997).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Maboudian, et al. Critical Review: Adhesion in Surface Micromechanical Structures: J. Vac. Sci Techno. B 15(1) Jan./Feb. 1997, pp. 1-20.
Magel, "Integrated Optic Devices Using Micromachined Metal Membranes," SPIE vol. 2686, 0-8194-2060-Mar. (1996).
Microchem, LOR Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elementd and Mutual Coupling," Microwave Scanning Antennas, vol. 2, pp. 131-141, (1966).
PCT/US02/13442, Search Report Sep. 13, 2002.
PCT/US04/20330 Search Report Nov. 8, 2004.
PCT/US05/029821 International Search Report (Dec. 27, 2005).
PCT/US05/030927 International Search Report (Jan. 25, 2006).
PCT/US05/031693 International Search Report.
PCT/US05/032331 International Search Report (Apr. 7, 2006).
PCT/US05/033558 Partial International Search Report (Feb. 24, 2006).
PCT/US2004/035820 International Search Report and Written Opinion (Apr. 11, 2005).
PCT/US96/17731 Search Report.
Penta Vacuum MEMS Etcher Specifications, http://www.pentavacuum.com/memes.htm.
Raley et al., "A Fabry-Perot Microinterferometer for Visible Wavelengths," IEEE Solid-State Sensor and Actuator Workshop, Jun. 1992, Hilton Head, SC.
Schnakenberg et al., "TMAHW Etchants for Silicon Micromachining," 1991 International Conference on Solid State Sensors and Actuators-Digest of Technical Papers, pp. 815-818 (1991).
Science and Technology, The Economist, pp. 89-90, (May 1999).
Search Report and Written Opinion for PCT/US05/33558 (May 19, 2005).
Search Report and written opinion PCT/US05/032647.
Search Report PCT/US05/030033 and Written Opinion.
Search Report PCT/US05/030902.
Search Report PCT/US05/032331 (Jan. 9, 2006).
Search Report PCT/US05/032331 (Apr. 7, 2006).
Sperger et al., "High Performance Patterned All-Dielectric Interference Colour Filter for Display Applications," SID Digest, pp. 81-83, (1994).
Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.
Stone, "Radiation and Optics, An Introduction to the Classical Theory," McGraw-Hill, pp. 340-343, (1963).
Tayebi et al. "Reducing the Effects of adhesion and friction in microelectromechanical systems (MEMS) through surface roughening: Comparison Between theory and experiments" http://jap.ajp.org/jap/copyright.isp Journal of applied Physics 98, 073528 (2005).
Thin Film Transistors- Materials and Processes-vol. 1 Amorphous Silicon Thin Film Transistors ed. Yue Kuo, Kluwer Academic Publishers, Boston (2004).
Walker et al., "Electron-beam-tunable Interference Filter Spatial Light Modulator," Optics Letters vol. 13, No. 5, pp. 345-347, (May 1988).
Williams et al., "Etch Rates for Micromachining Processing," Journal of Microelectromechanical Systems, vol. 5, No. 4, pp. 256-259 (Dec. 1996).
Winters et al., "The etching of silicon with XeF2 vapor. Applied Physics Letters," vol. 34, No. 1, pp. 70-73 (Jan. 1979).
Winton, "A novel way to capture solar energy," Chemical Week, (May 1985).
Wu, "Design of a Reflective Color LCD Using Optical Interference Reflectors," ASIA Display '95, pp. 929-931, (Oct. 1995).
Xactix Xetch Product Information.
Xactix Xetch X Specifications, http://xactix.com/Xtech X3specs.htm. Jan. 5, 2005.
Zhou et al., "Waveguide Panel Display Using Electromechanical Spatial Modulators" SID Digest, vol. XXIX, (1998).
Matsumoto et al., "Novel prevention method of stiction using silicon anodization for SOI structure", *Sensors and Actuators*, vol. A72 (1999), pp. 153-159.
International Search Report dated Mar. 25, 2008 in counterpart International Appl. No. PCT/US2007/009274.
Chiou et al., "A Novel Capacitance Control Design of Tunable Capacitor Using Multiple Electrostatic Driving Electrodes," IEEE Nano 2001, M 3.1, Nanoelectronics and Giga-Scale Systems (Special Session), Oct. 29, 2001, pp. 319-324.
Fork, et al., "P-67: Chip on Glass Bonding using StressedMetal™ Technology" Sid 05 Digest, May 24, 2005.
Hall, Integrated optical inteferometric detection method for micromachined capacitive acoustic transducers, App. Phy. Let. 80:20(3859-3961) May 20, 2002.
Kawamura et al., Fabrication of fine metal microstructures packaged in the bonded glass substrates, Proceedings of SPIE, vol. 3893, pp. 486-493, 1999.
Watanabe et al., Reduction of microtrenching and island formation in oxide plasma etching by employing electron beam charge neutralization, Applied Physics Letters, 79:17(2698-2700), Oct. 22, 2001.
Office Action dated Jun. 7, 2007 in U.S. Appl. No. 11/407,470.
Office Action dated Dec. 21, 2006 in U.S. Appl. No. 11/407,470.
Crouse, "Self-ordered pore structure of anodized aluminum on silicon and pattern transfer" Applied Physics Letters, vol. 76, No. 1, Jan. 3, 2000. pp. 49-51.
Lee et al., "Improvement of the surface characteristics of sputtered metal layer for a MEMS micro-mirror switch," Thin Solid Films, vol. 447, Jan. 30, 2004, pp. 615-618.

* cited by examiner

MICROELECTROMECHANICAL DEVICE AND METHOD UTILIZING A POROUS SURFACE

CROSS-REFERENCE TO RELATED APPLICATIONS

This application is a continuation of U.S. patent application Ser. No. 11/407,470, filed Apr. 19, 2006, the disclosure of which is hereby incorporated by reference in its entirety herein. This application is also related to U.S. application Ser. No. 11/189,690, filed Jul. 26, 2005 entitled SYSTEM AND METHOD FOR MICROELECTROMECHANICAL OPERATION OF AN INTERFEROMETRIC MODULATOR; U.S. application Ser. No. 11/406,776, filed Apr. 19, 2006 entitled NON-PLANAR SURFACE STRUCTURES AND PROCESS FOR MICROELECTROMECHANICAL SYSTEMS (Inventors: Ming Hau Tung, Sriram Akella, William J. Cummings and Lior Kogut); U.S. application Ser. No. 11/406,981, filed Apr. 19, 2006 entitled NON-PLANAR SURFACE STRUCTURES AND PROCESS FOR MICROELECTROMECHANICAL SYSTEMS (Inventors: Qi Luo, Sriram Akella, and Lior Kogut); U.S. application Ser. No. 11/406,866, filed Apr. 19, 2006 entitled NON-PLANAR SURFACE STRUCTURES AND PROCESS FOR MICROELECTROMECHANICAL SYSTEMS (Inventors: Teruo Sasagawa, Lior Kogut, and Ming-Hau Tung); and U.S. application Ser. No. 11/407,730, filed Apr. 19, 2006 entitled MICROELECTROMECHANICAL DEVICE AND METHOD UTILIZING NANOPARTICLES (Inventors: Teruo Sasagawa and Lior Kogut).

BACKGROUND

1. Field of the Invention

This invention relates to microelectromechanical devices and methods for making the same. More particularly, this invention relates to engineering surfaces of moving and stationary electrode assemblies on either side of collapsing gap.

2. Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In one aspect, a microelectromechanical systems (MEMS) device is provided. The MEMS device includes a first electrode having a first surface and a second electrode having a second surface facing the first surface. The second electrode is movable in a gap between a first position and a second position, where the first position is a first distance from the first electrode. The second position is a second distance from the first electrode, the second distance being greater than the first distance. At least one of the electrodes comprises a porous layer having a porous surface facing the other of the electrodes.

The MEMS device may serve as an interferometric modulator. In the MEMS device, the porous layer may comprise an anodized layer, particularly anodized aluminum oxide (alumina or $Al_2O_3$). The porous layer may have a hexagonal array structure. In one embodiment, the porous layer is formed on the first, stationary electrode either on a dielectric or directly on a conductor. In another embodiment, the porous layer is formed under the second or moving electrode, preferably in contact with a reflective layer.

In another aspect, a display system is provided. The display device includes: the MEMS device described above; a display; a processor that is in electrical communication with the display, the processor being configured to process image data; and a memory device in electrical communication with the processor.

In yet another aspect, an interferometric modulator is provided. The interferometric modulator includes transmissive means for at least partially transmitting incident light, the transmissive means having a first surface. Reflective means for substantially reflecting incident light has a second surface facing the first surface. Moving means are provided for moving the reflective means relative to the transmissive means between a driven position and an undriven position, the driven position being closer to the transmissive means than is the undriven position. At least one of the transmissive and reflective means includes a porous surface facing the other of the transmissive and reflective means.

In still another aspect, a method of making an interferometric modulator is provided. The method includes providing transparent and reflective electrodes facing each other across a collapsible gap. A metallic layer is provided on at least one of facing surfaces. The metallic layer is anodized to form an anodized layer.

In another aspect, a method of making an electrostatic microelectromechanical systems device is provided. The method includes providing transparent and reflective electrodes facing each other across a cavity. A porous layer is provided on at least one of the electrodes, where the porous layer faces the other of the electrodes.

In another aspect, a method of making a microelectromechanical systems device is provided. The method includes forming a lower electrode. A sacrificial layer is formed over the lower electrode. An upper electrode porous layer is formed between forming the lower electrode and forming the upper electrode.

In another aspect, an interferometric modulator made by the method described above is provided.

DETAILED DESCRIPTION OF PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Stiction can be one of the most important reliability issues in microelectromechanical systems in general and interferometric modulator in particular. "Stiction," as used herein, refers to a tendency of a movable layer in an actuated position to stick to a stationary layer in a microelectromechanical system. In embodiments of the invention, an interferometric modulator, which is an optical MEMS device, employs an anodized porous layer facing the MEMS cavity on either a movable or stationary layer.

Figure 1:
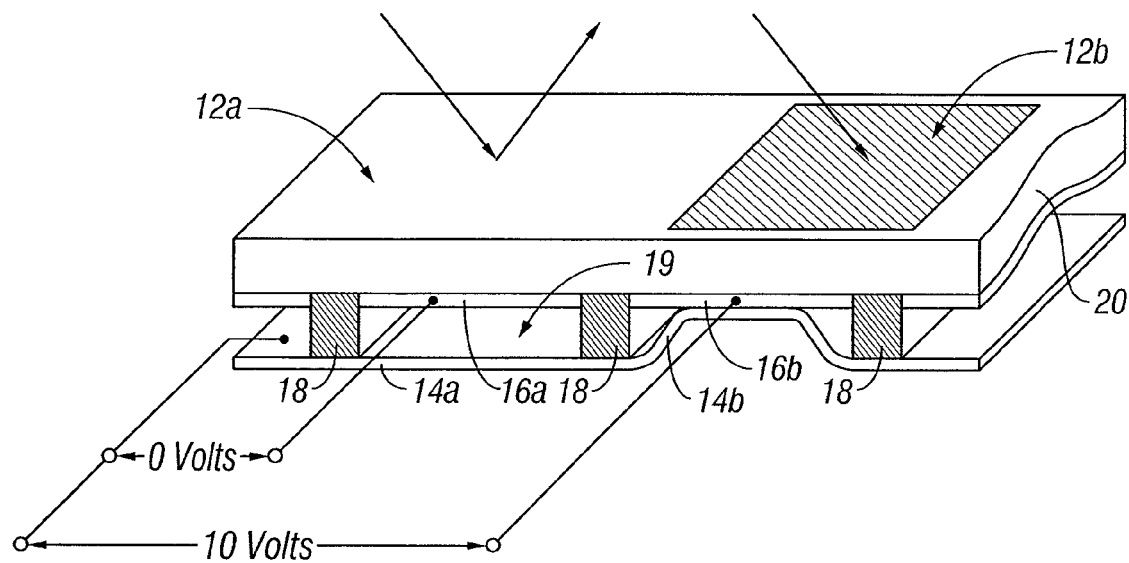
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metallic layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap or cavity 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
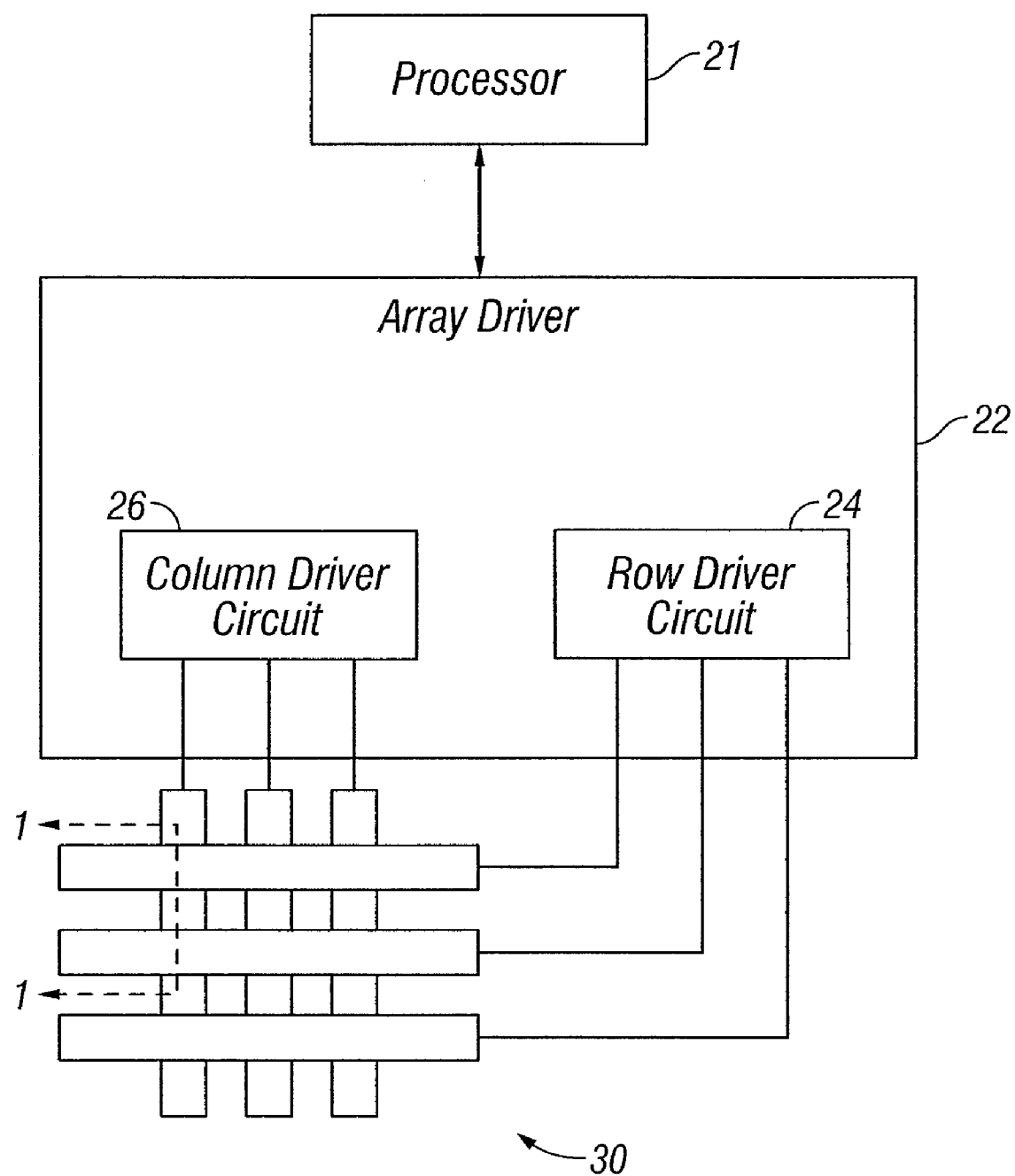
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a panel or display array (display) 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
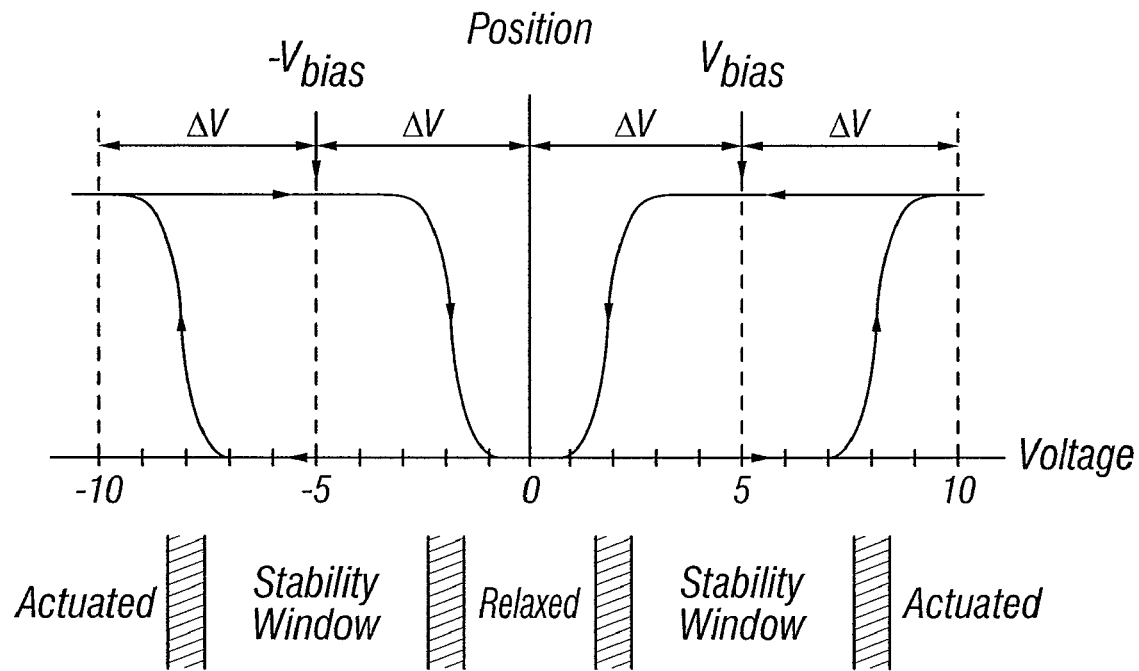
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
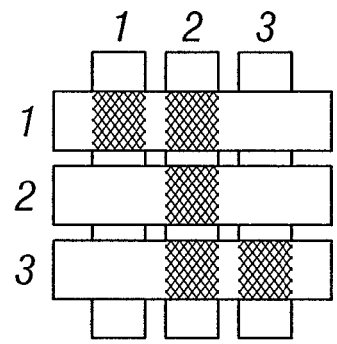
FIGS. 5A and 5B illustrate one exemplary timing diagram for row and column signals that may be used to write a frame of display data to the 3×3 interferometric modulator display of FIG. 2.
Figure 5B:
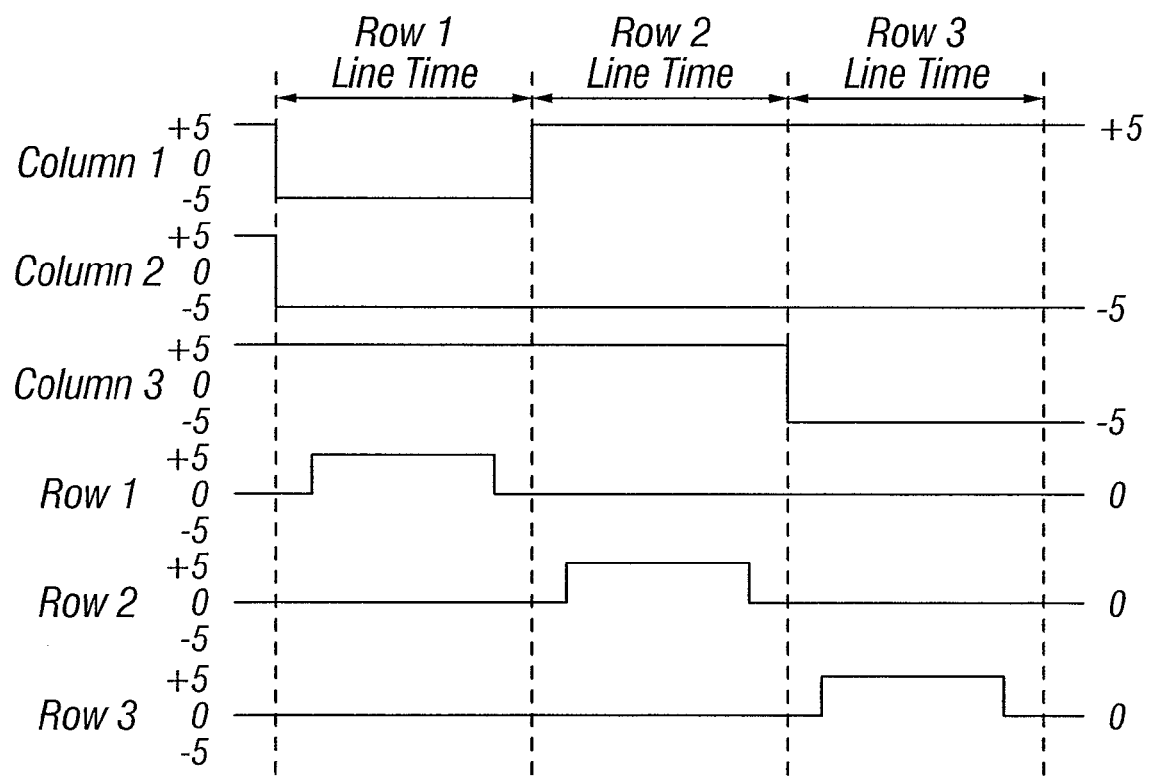

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
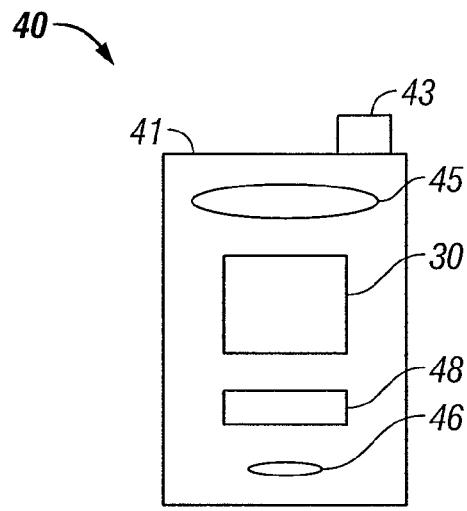
FIGS. 6A and 6B are system block diagrams illustrating an embodiment of a visual display device comprising a plurality of interferometric modulators.
Figure 6B:
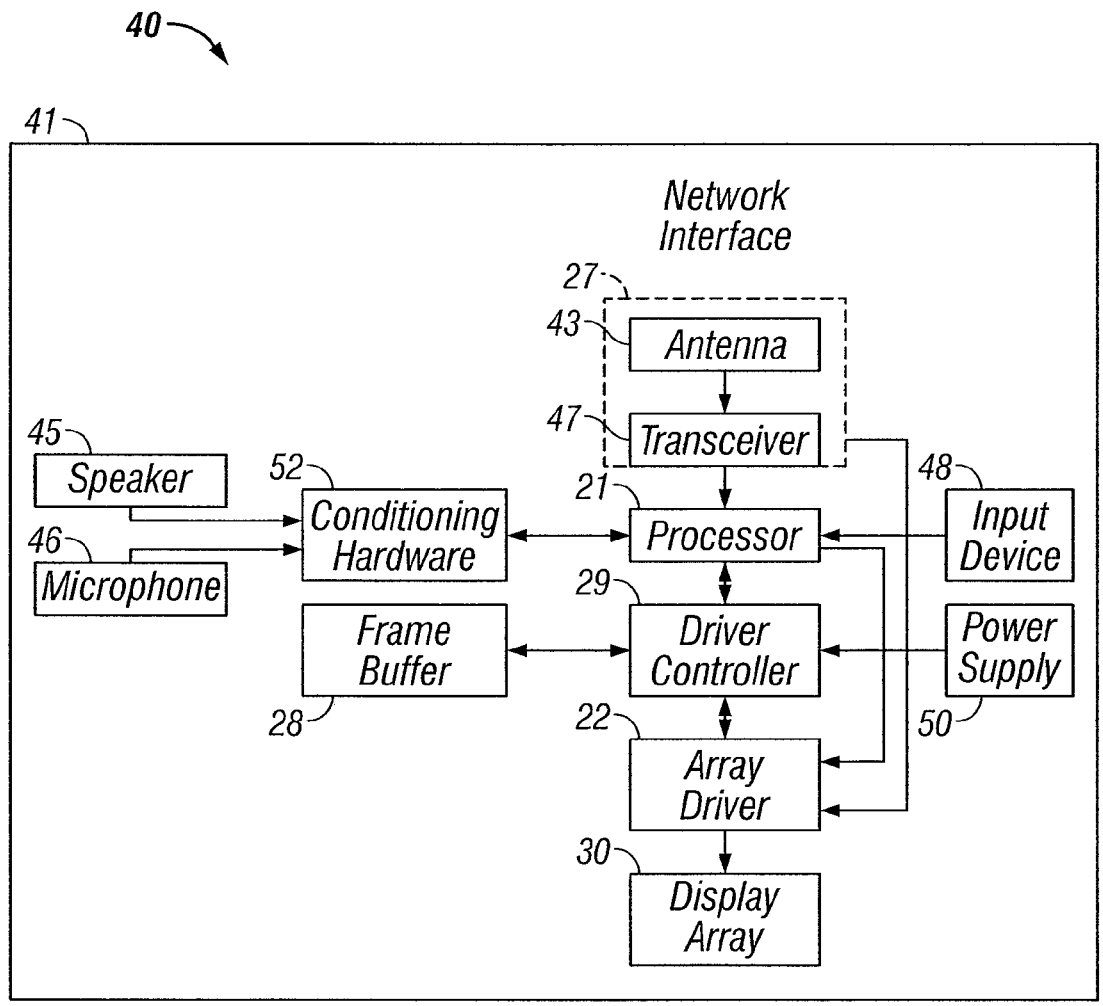

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to the processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28 and to the array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
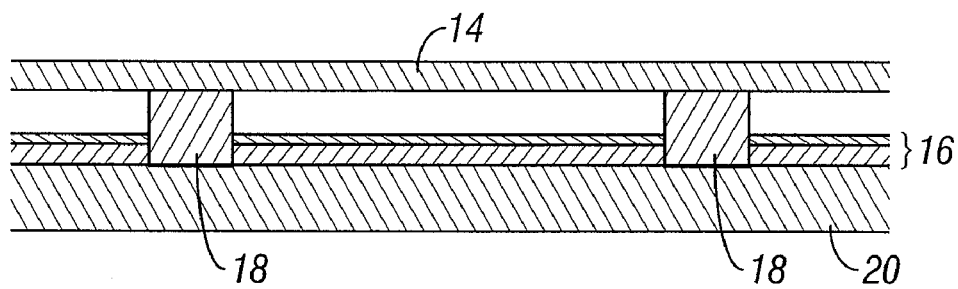
FIG. 7A is a cross section of the device of FIG. 1.
Figure 7B:
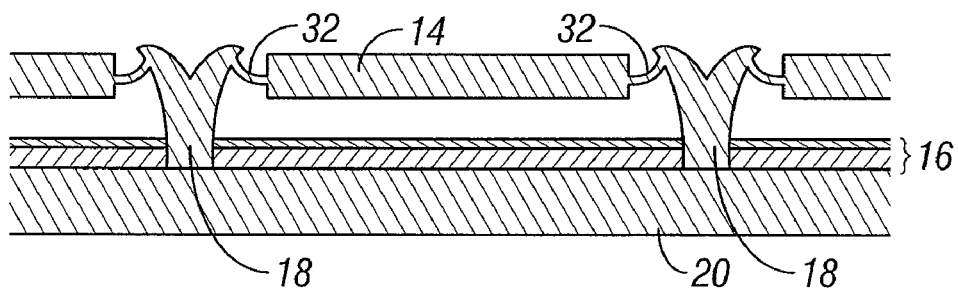
FIG. 7B is a cross section of an alternative embodiment of an interferometric modulator.
Figure 7C:
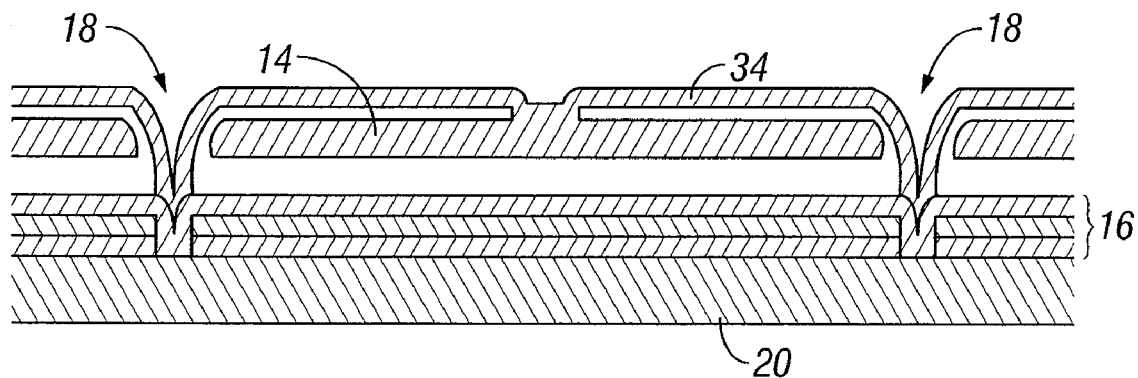
FIG. 7C is a cross section of another alternative embodiment of an interferometric modulator.
Figure 7D:
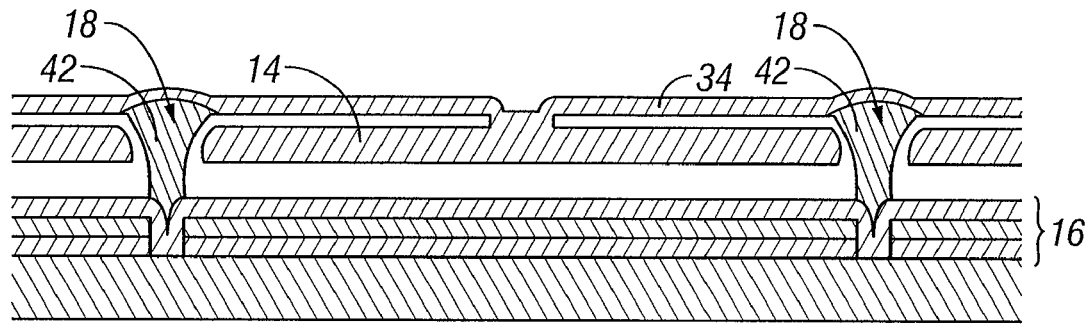
FIG. 7D is a cross section of yet another alternative embodiment of an interferometric modulator.
Figure 7E:
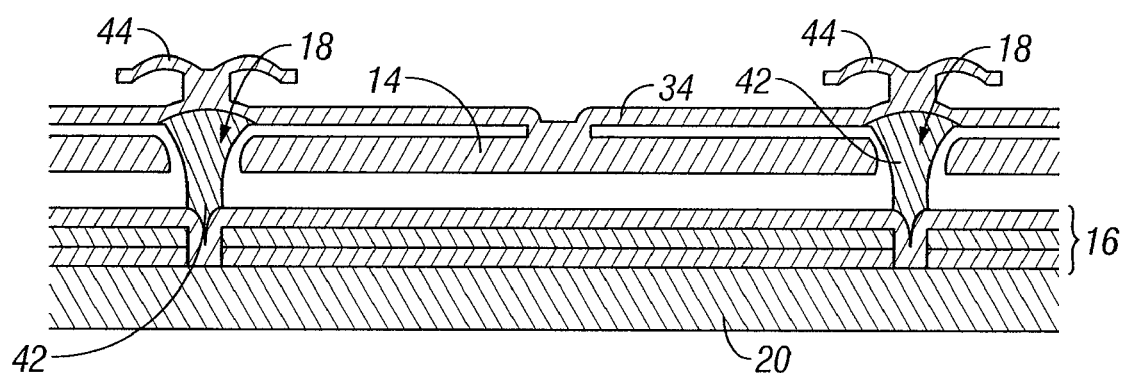
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 at various locations. The connections are herein referred to as support structures or posts 18. The embodiment illustrated in FIG. 7D has support structures 18 including support post plugs 42 upon which the deformable layer 34 rests. The movable reflective layer 14 remains suspended over the cavity, as in FIGS. 7A-7C, but the deformable layer 34 does not form the support posts 18 by filling holes between the deformable layer 34 and the optical stack 16. Rather, the support posts 18 are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the movable electrode is arranged. In these embodiments, the reflective layer 14 optically shields some portions of the interferometric modulator on the side of the reflective layer opposite the substrate 20, including the deformable layer 34 and the bus structure 44. This allows the shielded areas to be configured and operated upon without negatively affecting the image quality. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Use of Porous Layer

Stiction can be one of the most important reliability issues in microelectromechanical systems in general and interferometric modulator in particular. "Stiction," as used herein, refers to a tendency of a movable layer in an actuated position to stick to a stationary layer in a microelectromechanical system.

Stiction occurs when the total of adhesion forces between two layers is greater than a restoring force. Adhesion forces become more significant when decreasing device dimensions. Restoring forces, however, decrease with decreasing device sizes. Thus, stiction is an inherent reliability concern for microelectromechanical systems of small dimensions. Accordingly, there is a need to provide a solution to the stiction problem in microelectromechanical systems.

Adhesion forces may arise from several mechanisms such as, capillary forces, van der Waals interactions, chemical bonds, solid bridging, etc. Adhesion forces, including short range and long range adhesion forces, depend on contact area and surface separation between two layers. Short range adhesion forces may be decreased by decreasing contact area between contacting surfaces, e.g., by increasing an effective hardness and/or roughening the surfaces. Long-range adhesion forces may be decreased by increasing an average surface separation between two layers in the actuated or collapsed condition of the MEMS.

Creep is another source of increasing stiction in a microelectromechanical device. "Creep," used herein, refers to time-dependent material deformation which occurs as a result of exposure to high stress and/or high temperature. Deformation resulting from creep brings about an increase in contact area and a decrease in surface separation, thus increasing stiction.

In the illustrated embodiments, a surface on a MEMS electrode that faces the collapsing gap or cavity is defined by a porous layer. Accordingly, when actuated, the contact area between the surfaces that meet is reduced and stiction is thereby alleviated.

In one embodiment, an interferometric modulator has a fixed electrode having a porous layer. The porous layer is configured to include a porous surface facing a movable electrode. The porous layer is a layer of aluminum oxide (alumina or $Al_2O_3$) formed by anodizing aluminum. The porous surface reduces contact area between the electrodes, thereby reducing stiction. In addition, because the fixed electrode surface has pores recessed into the electrode, an average surface separation between the fixed and movable electrodes is increased. Thus, both short and long range adhesion forces can be effectively reduced, thereby decreasing stiction between the electrodes.

In another embodiment, an interferometric modulator has a movable reflective electrode having a porous layer. The porous layer is configured to include a porous surface facing a fixed electrode. This configuration decreases contact area. In addition, the porous layer increases an effective hardness of the movable electrode, and thus effectively reduces contact area between the electrodes by reducing the layers' ability to conform to one another in the collapsed or actuated state. In addition, the porous layer may prevent creep of the movable electrode and thus can prevent stiction arising from creep.

In yet another embodiment, an interferometric modulator has a movable electrode and a fixed electrode, both of which have a porous layer. Each porous layer is configured to include a porous surface facing the other electrode. This configuration decreases contact area similarly to the above embodiments. In addition, the porous layer of the moving electrode increases an effective hardness of the electrode. In addition, the porous layer may prevent creep of the movable electrode and thus can prevent stiction arising from creep.

While illustrated in the context of optical MEMS devices, particularly interferometric modulators, the skilled artisan will appreciate that the reduced stiction between collapsed parts is advantageous for other MEMS devices, such as electromechanical capacitive switches.

Figure 8:
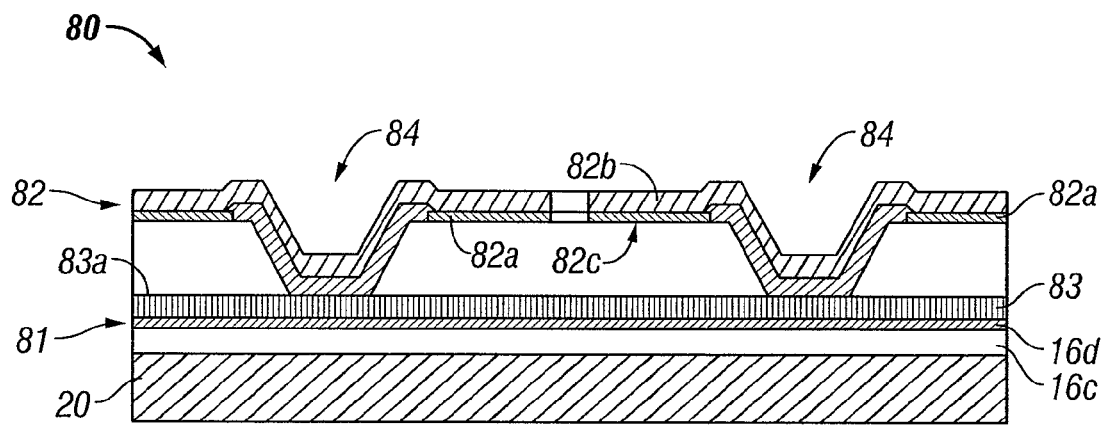
FIG. 8 is a cross section of an embodiment of an interferometric modulator having a porous layer on a fixed electrode.

FIG. 8 illustrates an interferometric modulator 80 according to an embodiment. The interferometric modulator 80 has a fixed electrode 81 (preferably at least partially transparent for the illustrated embodiment) and a movable electrode 82 (preferably reflective for the illustrated embodiment) which is supported by support posts 84. The fixed electrode 81 is configured to have a porous top surface 83a which faces the movable electrode 82. The porous surface 83a reduces contact area between the electrodes 81 and 82, and increases surface separation between the electrodes 81 and 82, thereby reducing stiction between them.

In the illustrated embodiment, the movable electrode 82 of the interferometric modulator 80 is in a relaxed position. In the relaxed position, the movable electrode 82 is at a relative large distance (e.g., 100 nm to 600 nm) from the fixed electrode. The distance between the electrodes 81 and 82 depends on desired color. The movable electrode 82 can move down to an actuated position (see FIG. 1, modulator 12). In the actuated position, the movable electrode 82 is positioned more closely adjacent to the fixed electrode 81, and may be in contact with the top surface 83a of the fixed electrode 81.

The illustrated fixed electrode 81 overlies a transparent substrate 20, and includes a transparent conductor such as the illustrated indium tin oxide (ITO) layer 16c overlying the substrate 20, and a metallic semitransparent layer 16d overlying the ITO layer 16c. The metallic layer 16d is preferably formed of chromium. In another embodiment for a broadband white interferometric modulator, the metallic layer 16d may be replaced with a semiconductor layer. The semiconductor layer is preferably formed of germanium. In one embodiment, the ITO layer 16c may have a thickness between about 100 Å and about 800 Å. The metallic layer 16d may have a thickness between about 1 Å and about 50 Å, preferably between about 10 Å and about 40 Å. In certain embodiments, the metallic layer may be omitted. In other embodiments, the fixed electrode 81 may further include a dielectric layer which will be described later in detail. Together, the layers define an optical stack or fixed electrode 81.

In the illustrated embodiment, the movable electrode 82 includes a reflective layer 82a and a mechanical or deformable layer 82b. In the illustrated embodiment, the reflective layer 82a is attached or fused to the deformable layer 82b; in other arrangements, the reflector or mirror may be suspended from the deformable layer (see, e.g., FIGS. 7C-7E). The reflective layer 82a is preferably formed of a reflective metal, preferably, Al, Au, Ag, or an alloy of the foregoing, and is thick enough to reflect light incident upon the substrate for interferometric effect. The deformable layer 82b is preferably formed of nickel. In certain embodiments where the MEMS device is used as an electromechanical capacitive switch, the movable electrode 82 may be formed of a conductor such as Cu, Pt, Ni, Au, Al, or an alloy of the foregoing. The deformable layer 82b preferably has a thickness that is sufficient to provide mechanical support while being sufficiently thin and flexible to allow the movable electrode 82 to move toward the fixed electrode 81. The deformable layer 82b may have a thickness on the order of several thousand angstroms. In an exemplary embodiment, the reflective layer 82a has a thickness of about 300 Å, and the deformable layer 82b has a thickness of about 1000 Å. The thicknesses of the layers 82a and 82b can be different in other embodiments.

The support posts 84 are configured to support the movable electrode 82. The posts 84 can be made of a number of materials, but in the illustrated embodiment are formed of an inorganic dielectric material, such as silicon nitride, silicon dioxide or aluminum oxide. The deformable layer 82b, which is preferably formed of nickel, is configured to cover top surfaces of the support posts 84 and the reflective layer 82a, as shown in FIG. 8. In other arrangements, the support posts can include a "rivet" formed in the depression above the deformable layer. In certain embodiments, the reflective layer may be fused or tethered to the support posts, as shown in FIGS. 7A and 7B.

In the illustrated embodiment, the fixed electrode 81 includes a porous layer 83. The porous layer 83 has the porous surface 83a facing the movable electrode 82. Preferably, the porous layer 83 is formed by anodizing an aluminum layer and is formed of aluminum oxide ($Al_2O_3$). Preferably, the porous layer 83 has a pore density of between about $10^{12}$ $m^{-2}$ and about $10^{15}$ $m^{-2}$. The porous layer may have a thickness of between about 300 Å and about 1,500 Å. The pore density may be controlled to optimally reduce stiction while minimizing interference with optical properties of the interferometric modulator.

Figure 9A:
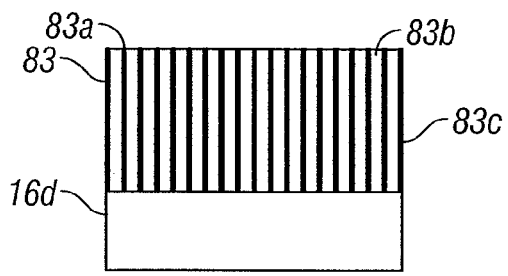
FIG. 9A is an enlarged cross section partially illustrating a porous layer and a metallic layer of the interferometric modulator of FIG. 8.

FIG. 9A illustrates an enlarged cross-section of the porous layer 83 and the underlying metallic layer 16d. The porous layer 83 includes vertical walls 83c and pores 83b, as shown in FIG. 9A. The illustrated pores 83b penetrate the porous layer 83 down to the metallic layer 16d. In certain embodiments, there may be unanodized residual metal under the porous layer 83. The unanodized metal may replace the metallic layer 16d serving as an absorber. This configuration may be obtained by a partial anodizing process which will be described later in detail. The remaining aluminum layer, which would intervene between the porous layer 83 and the ITO layer 16c, may have a thickness selected to produce a reflectance of between about 33% and 37%, for example between about 30 Å and about 50 Å.

Figure 9B:
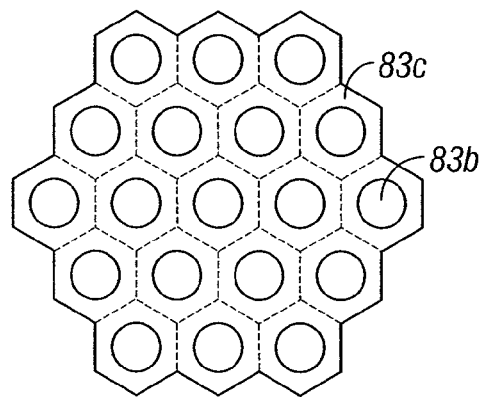
FIG. 9B is a top plan view partially illustrating the porous layer of FIG. 9A.

FIG. 9B is a partial top plan view of the porous layer 83. The porous layer 83 has a hexagonal array structure, as shown in FIG. 9B. The hexagonal array structure has pores 83b of substantially the same size which are uniformly distributed throughout the porous surface 83a. Stiction between the electrodes in the actuated position may be decreased by increasing the average diameter of the pores 83b and/or by increasing pore density. However, optical performance of the interferometric modulator 80 may be negatively affected by the pores 83b. For examples, light passing through the pores 83b may traverse a different optical path compared to light passing through the walls 83c. However, this drawback may be reduced by controlling the thickness of the porous anodized alumina layer and pore dimension and density. The pore size and pore density of the porous layer 83 may be interdependently adjusted to optimally reduce stiction while minimizing interference with optical properties of the interferometric modulator. In one embodiment, the pores 83b have an average width or diameter between about 50 Å and about 3,000 Å, and the pore density is between $10^{12}$ m$^{-2}$ and about $10^{15}$ m$^{-2}$. More preferably, the pores may have an average diameter between about 100 Å and about 1,500 Å, and the pore density is between $10^{13}$ m$^{-2}$ and about $10^{14}$ m$^{-2}$.

The above pore diameter and thickness of the porous layer 83 have been chosen to prevent full penetration into the pores by a sacrificial material such as molybdenum when forming a sacrificial layer over the porous layer, as will be better understood from the description of FIGS. 12A-12C below. Because the sacrificial material does not fully penetrate into the pores, it can be easily removed at a release step which will be later described.

In the actuated position, application of a voltage causes electrostatic attraction between the electrodes 81, 82, and the movable electrode 82 is positioned more closely adjacent to the porous surface 83a of the fixed electrode 81. A bottom surface 82c of the movable electrode 82 is close to and typically in contact with the porous surface 83a. Because the porous surface 83a of the fixed electrode 81 has pores 83b, contact area between the surfaces of the fixed and movable electrodes 81 and 82 is reduced by the total area of the pores 83b. Thus, short range adhesion forces between the contacting surfaces of the electrodes decrease. In addition, because of the pores 83b, the average surface separation between the electrodes 81 and 82 increases compared with that of an unmodified interferometric modulator. Thus, long range forces are also reduced. These effects in combination significantly reduce stiction between the electrodes.

In addition, an optical constant of the fixed electrode 81 may be controlled by adjusting the porosity of the porous layer 83. For example, a refractive index of the fixed electrode 81 may be controlled by changing the porosity of the porous layer 83. The refractive index of the porous layer 83 may be represented by Equation 1 below:

$$\text{Reflective Index}(n) = (n_{Al2O3} - 1)X + 1, (0 < X < 1) \quad \text{Equation 1}$$

In Equation 1, $n_{Al2O3}$ is the refractive index of $Al_2O_3$, and X is a porosity of the porous layer ("1" indicates no pores while "0" indicates air). In the equation, the refractive index may be decreased by increasing the porosity of the porous layer 83.

In addition, dielectric properties, e.g., a dielectric constant, of the fixed electrode 81 may be tailored by controlling the porosity of the porous layer 83. The porous layer 83 has the vertical walls 83c of aluminum oxide and the pores 83b filled with air. Because both aluminum oxide and air are dielectric materials, the capacitance of the porous layer 83 can be controlled by adjusting the area ratio of the pores to the vertical walls, i.e., the porosity of the layer 83. The capacitance of the porous layer may be decreased by increasing the porosity of the layer. A lower capacitance is advantageous in that the interferometric modulator can consume less power. In addition, a lower capacitance reduces electrical response time, which equals to electrical resistance multiplied by capacitance. However, a low capacitance may negatively affect the hysteresis characteristics of the interferometric modulator. The porosity should therefore be optimally adjusted to achieve low power consumption while not negatively affecting the hysteresis properties. In the illustrated embodiments, the porous layer 83, because it is dielectric, replaces a continuous dielectric layer which would serve to prevent electrical shorting between the fixed and movable electrodes in the actuated position.

Figure 10A:
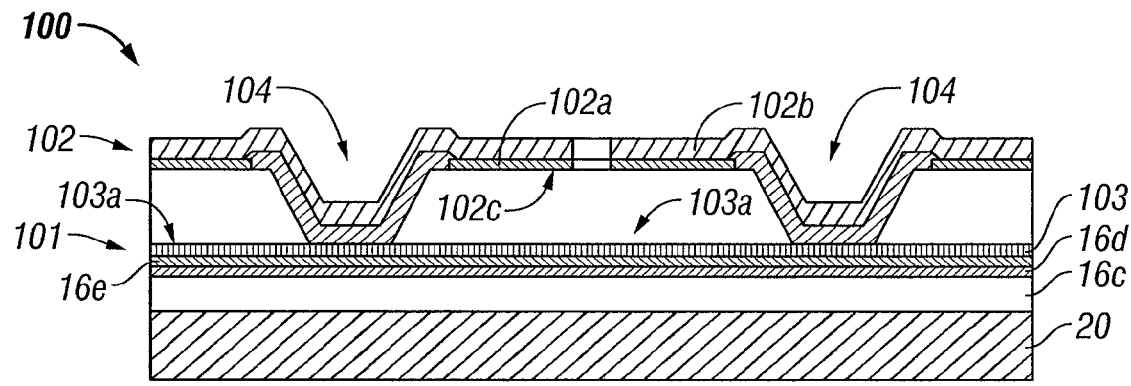
FIG. 10A is a cross section of another embodiment of an interferometric modulator having a porous layer on a fixed electrode.

FIG. 10A illustrates an interferometric modulator 100 according to another embodiment. The interferometric modulator 100 has a fixed electrode 101 and a movable electrode 102 supported by support posts 104. In the illustrated embodiment, a fixed electrode 101 overlies a transparent substrate 20, and includes a transparent conductor, such as the illustrated indium tin oxide (ITO) layer 16c overlying the substrate 20, a metallic layer 16d overlying the ITO layer 16c, and a dielectric layer 16e overlying the metallic layer 16d. The metallic layer 16d is preferably formed of chromium. In another embodiment for a broad-band white interferometric modulator, the metallic layer 16d may be replaced with a semiconductor layer. The semiconductor layer is preferably formed of germanium. The dielectric layer 16e is preferably formed of silicon dioxide and/or aluminum oxide and serves to prevent the two electrodes from shorting during operation. In one embodiment, the dielectric layer 16e may have a two-layered structure, including an upper layer and a lower layer (not shown). The upper layer may be formed of aluminum oxide (see 16f of FIG. 11 and attendant description) which can serve as an etch stop layer during a "release" etch of the sacrificial layer that defines the cavity between electrodes, as will be better appreciated from the description of FIGS. 12 and 13 below. The lower layer may be formed of silicon dioxide. The dielectric layer 16e may have a thickness between about 100 Å and about 1,600 Å. Together, the layers define an optical stack 16. The movable electrode 102 and the support posts 104 can have a layer structure and material as described above with respect to those of FIG. 8.

Figure 10B:
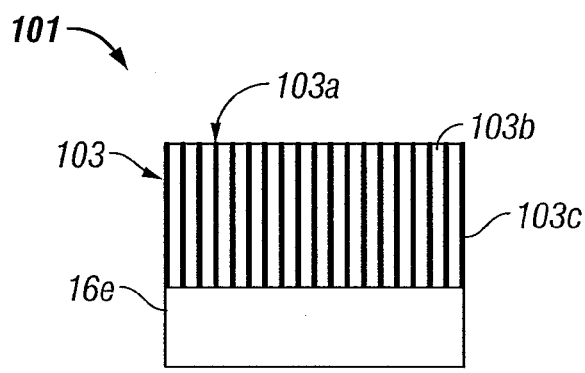
FIG. 10B is an enlarged cross section partially illustrating a porous layer and a dielectric layer of the interferometric modulator of FIG. 10A.

A porous layer 103 is formed over the dielectric layer 16e in the illustrated embodiment. FIG. 10B is an enlarged partial cross-section of the porous layer 103 and the dielectric layer 16e. The porous layer 103 has vertical walls 103c and pores 103b, as shown in FIG. 10B. The illustrated pores 103b penetrate the porous layer 103 down to the dielectric layer 16e. In the illustrated embodiment, the porous layer 103 may have a thickness between about 30 Å and about 200 Å.

In the actuated position (see e.g., FIG. 1, modulator 12b), a bottom surface 102c of the movable electrode 102 is close to and typically in contact with the porous surface 103a of the fixed electrode 101. Because the layer 103 produces a porous surface, contact area between the surfaces of the fixed and movable electrodes 101 and 102 is reduced, and surface separation between them is increased, thereby reducing stiction between them.

Figure 11:
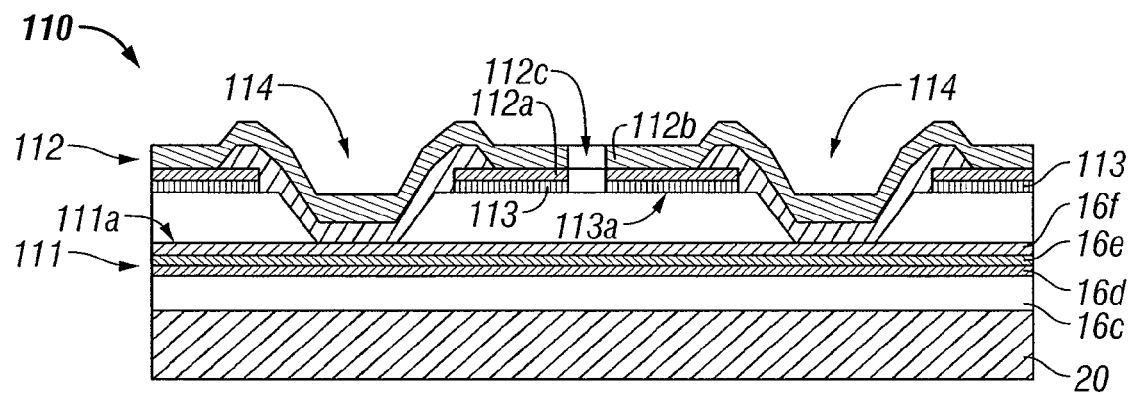
FIG. 11 is a cross section of an embodiment of an interferometric modulator having a porous layer on a movable electrode.

FIG. 11 illustrates an interferometric modulator 110 according to another embodiment. The interferometric modulator 110 has a fixed electrode 111 and a movable electrode 112 supported by support posts 114. The movable electrode 112 includes a porous bottom surface 113a which faces the fixed electrode 111. The porous surface 113a reduces contact area between the electrodes 111 and 112. The pores also provide larger surface separation. In addition, the illustrated porous surface 113a reduces creep because the porous surface is formed of a hard and creep-resistant material such as aluminum oxide. These effects in combination may significantly reduce stiction between the electrodes.

In FIG. 11, the movable electrode 112 of the interferometric modulator 110 is in a relaxed position. In the relaxed position, the movable electrode 112 is at a relative large distance from the fixed electrode 111. The movable electrode 112 can move down to an actuated position (not shown). In the actuated position, the movable electrode 112 is close to and typically in contact with a top surface 111a of the fixed electrode 111.

The fixed electrode 111 overlies a transparent substrate 20, and includes an indium tin oxide (ITO) layer 16c overlying the substrate 20, a metallic layer 16d overlying the ITO layer 16c, a first dielectric layer 16e overlying the metallic layer 16d, and a second dielectric layer 16f overlying the first dielectric layer 16e. The metallic layer 16d is preferably formed of chromium. In another embodiment for a broadband white interferometric modulator, the metallic layer 16d may be replaced with a semiconductor layer. The semiconductor layer is preferably formed of germanium. The first dielectric layer 16e may be formed of silicon dioxide. The second dielectric layer 16f may be formed of aluminum oxide and may serve as an etch stopper during the release etch. In certain embodiments, either or both of the dielectric layers 16e and 16f may be omitted. In one embodiment, the ITO layer 16c may have a thickness between about 100 Å and about 800 Å. The metallic layer 16d may have a semitransparent thickness, preferably between about 1 Å and about 50 Å, more preferably between about 10 Å and about 40 Å. The overall thickness of the first and second dielectric layers 16e and 16f may be between about 100 Å and about 1,600 Å. In other embodiments, the thicknesses of the dielectric layers may be adjusted such that the optical stack 16 is a color filter.

The movable electrode 112 may include a reflective layer 112a and a deformable layer 112b. In the illustrated embodiment, the reflective layer 112a is preferably formed of a reflective metal, preferably, Al, Au, Ag, or an alloy of the foregoing. In certain embodiments where the MEMS device is used as an electromechanical capacitive switch, the movable electrode 112 may be formed of a conductor such as Cu, Pt, Ni, Au, Al, or an alloy of the foregoing. The deformable layer 112b is preferably formed of nickel. The layers 112a and 112b can have thicknesses as described above with respect to the layers 82a and 82b of FIG. 8.

The support posts 114 are configured to support the movable electrode 112, and is preferably formed of a dielectric material. The support posts 114 can be as described above with respect to the support post 84 of FIG. 8. The deformable layer 112b, which is preferably formed of nickel, covers top surfaces of the post 114 and the reflective layer 112a, as shown in FIG. 11. In other embodiments, the reflective layer may be suspended from the deformable layer, as shown in FIGS. 7C-7E. In certain embodiments, the reflective layer may be fused or tethered to the support posts, as shown in FIGS. 7A and 7B.

In the illustrated embodiment, the movable electrode 112 has a porous layer 113. The porous layer 113 has a porous surface 113a facing the fixed electrode 111. The porous layer 113 is preferably formed of aluminum oxide ($Al_2O_3$) which has been formed by anodizing aluminum. Preferably, the porous layer 113 has a pore density of between about $10^{12}$ $m^{-2}$ and about $10^{15}$ $m^{-2}$. Preferably, the porous layer 113 has a thickness of between about 50 Å and about 1,500 Å.

The porous layer 113 has a hexagonal array structure similar to the one described above with reference to FIG. 9B. The porous layer 113 has pores uniformly distributed throughout the porous surface 113a. The pores may have an average diameter between about 50 Å and about 3,000 Å.

The above pore diameter and thickness of the porous layer 113 have been chosen to prevent full penetration into the pores by deposited electrode material when forming the overlying aluminum layer 112a, as will be better understood from the description of FIGS. 13A-13C below. Thus, there remain some air cavities in the pores at the bottom of the porous layer 113. Because the porous layer material ($Al_2O_3$) and air are dielectric, the porous layer 113 can replace a dielectric layer of the fixed electrode 111.

In the actuated position (see FIG. 1, modulator 12b), the porous surface 113a of the movable electrode 112 is closer, typically in contact with the top surface 111a of the fixed electrode 111. Because of the porous surface 113a, contact area between the surfaces of the fixed and movable electrodes 111 and 112 is reduced, thereby reducing stiction.

In an embodiment where the reflective layer 112a is formed of aluminum, because aluminum oxide has a higher hardness than aluminum, the porous aluminum oxide layer 113 increases an effective hardness of the movable electrode 112, relative to the aluminum reflective layer 112a, and thus reduces contact area of the aluminum layer 112a. This effect also alleviates the increase in contact area that accompanies creep, and thus reduces an increase in stiction over time.

In an unpictured embodiment, an interferometric modulator has a movable electrode and a fixed electrode, both of which have a porous layer. Each porous layer is configured to include a porous surface facing the other electrode. The structures and materials of the electrodes and the porous layers can be as described above with reference to FIGS. 8-11.

The interferometric modulators of the above embodiments are described by way of examples. The porous layers in the embodiments may generally apply to microelectromechanical devices which have electrodes different from those of the embodiments. A skilled artisan will appreciate that electrode structure and configuration may be varied depending on the design of a given microelectromechanical device.

Method of Making an Interferometric Modulator

FIGS. 12A-12E illustrate a method of making the interferometric modulator of FIG. 8 according to an embodiment. In the method, a porous surface is formed on a fixed electrode surface facing a movable electrode.

Figure 12A:
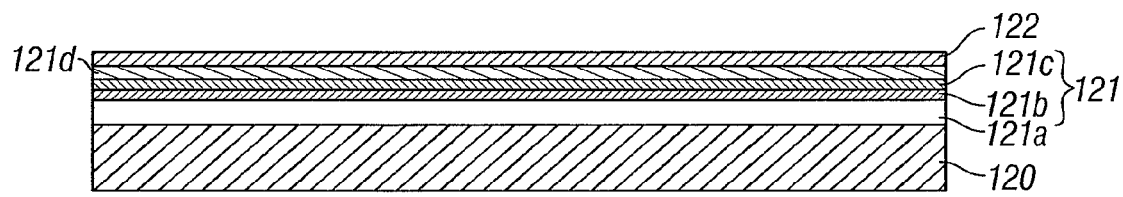
FIGS. 12A-12E are schematic cross sections illustrating a method of forming the interferometric modulator of FIG. 8 according to an embodiment.

In FIG. 12A, an optical stack 121 is provided over a transparent substrate 120. In the illustrated embodiment, the optical stack 121 has a transparent conductor in the form of an ITO layer 121a overlying the substrate 120, a metallic layer 121b overlying the ITO layer 121a, a first dielectric layer 121c overlying the metallic layer 121b, and a second dielectric layer 121d overlying the first dielectric layer 121c. The metallic layer 121b is preferably formed of chromium. In another embodiment for a broad-band white interferometric modulator, the metallic layer 121b may be replaced with a semiconductor layer. The semiconductor layer is preferably formed of germanium. The first dielectric layer 121c may be formed of silicon dioxide. The second dielectric layer 121d may be formed of aluminum oxide and may serve as an etch stop layer. The layers 121a-121d may have a thickness as described above with respect to the layers 16c-16f of FIG. 11. In certain embodiments, the optical stack may have only one dielectric layer or none, depending on materials and selectivity of a release etch which will be described later. In another embodiment, the optical stack may have an unanodized aluminum layer replacing the chromium layer 121b, and an anodized porous layer replacing the dielectric layers 121c and 121d, as will be described later in detail.

An aluminum layer 122 is provided over the second dielectric layer 121d, as shown in FIG. 12A. In the illustrated embodiment, the aluminum layer 122 has a thickness between about 20 Å and about 140 Å. In certain embodiments where the optical stack includes no dielectric layer, the aluminum layer may have a thickness between about 300 Å and about 1,500 Å.

Figure 12B:
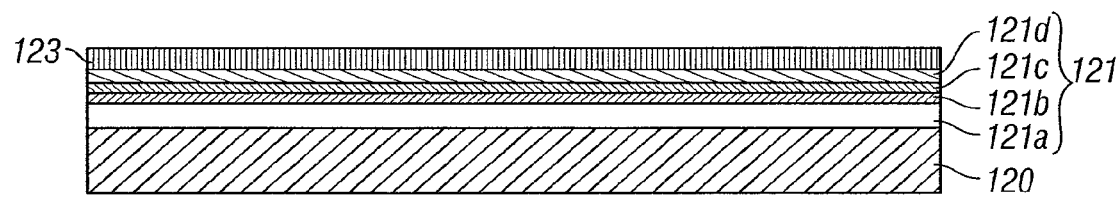

Next, as shown in FIG. 12B, the aluminum layer 122 is anodized to form a porous aluminum oxide layer 123. In anodizing the aluminum layer 122, desired pore spacing and diameter may be obtained by selecting an appropriate anodizing voltage and an anodizing electrolyte. Pore spacing and diameter tend to be proportional to the anodizing voltage with proportionality constants of 2.5 nmV$^{-1}$ for the pore spacing and 1.29 nmV$^{-1}$ for the pore diameter. In the illustrated embodiment, the anodizing voltage is preferably between about 5 V and about 300 V. In addition, examples of the anodizing electrolytes include, but are not limited to, sulfuric, phosphoric, oxalic, chromic, and citric acid. In the illustrated embodiment, a concentration of the anodizing electrolyte is preferably between about 0.1 M and about 1 M. The anodizing step is preferably performed for about 10 min. and about 100 min. at a temperature between about 0° C. and about 40° C.

The pores resulting from the above step have a width or diameter between about 50 Å and about 3,000 Å. In addition, after the anodizing step, the porous aluminum oxide layer 123 becomes about 1.2 to 1.7 times thicker than the aluminum layer 122. In the illustrated embodiment, the porous layer 123 has a thickness between about 30 Å and about 200 Å. In other embodiments where the optical stack includes no dielectric layer, the porous layer may have a thickness between about 300 Å and about 1,500 Å.

In the illustrated embodiment, the aluminum layer 122 has been fully anodized into the porous aluminum oxide layer 123. The pores of the porous layer 123 extend completely down to the second dielectric layer 121d. In certain embodiments where the fixed electrode includes neither a chromium layer nor a dielectric layer, the aluminum layer may be partially anodized, leaving a non-anodized residual layer of aluminum between an anodized porous layer and an underlying ITO layer. The residual aluminum layer serves as an absorber instead of the chromium layer.

Figure 12C:
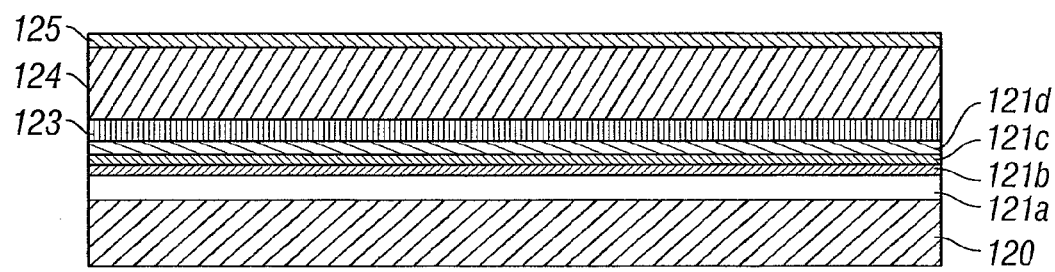

Subsequently, a sacrificial layer 124 is provided over the porous layer 123, as shown in FIG. 12C. The sacrificial layer 124 is preferably formed of a material capable of selective removal without harm to other materials that define the cavity. In the illustrated embodiment, the sacrificial layer 124 is formed of molybdenum. Other examples of sacrificial materials include silicon and tungsten. Because the diameters of the pores are very small, the sacrificial layer 124 does not fill the pores and thus can be completely removed by an etchant which will be described later. In addition, a thickness of the porous layer can be chosen to avoid filling the pores. A suitable deposition method, e.g., sputtering deposition, can also avoid filling the pores.

Next, steps for forming a movable electrode and support posts are performed. A reflective layer 125 is first deposited over the sacrificial layer 124, as shown in FIG. 12C. The reflective layer 125 is preferably formed of Al, Au, Ag, or an alloy of the foregoing. In certain embodiments where the MEMS device is used as an electromechanical capacitive switch, the layer 125 may be formed of a conductor such as Cu, Pt, Ni, Au, Al, or an alloy of the foregoing. In the illustrated optical MEMS embodiment, the reflective layer 125 is formed of aluminum (Al). The reflective layer 125 is then patterned using a lithographic process, preferably a photolithographic process. Subsequently, another lithographic process, preferably a photolithographic process, is performed to pattern the sacrificial layer 124 to provide recesses for support posts 127. Then, a material for posts 127, preferably silicon dioxide, is deposited and patterned over exposed surfaces, including surfaces of the sacrificial layer 124 and the reflective layer 125.

Figure 12D:
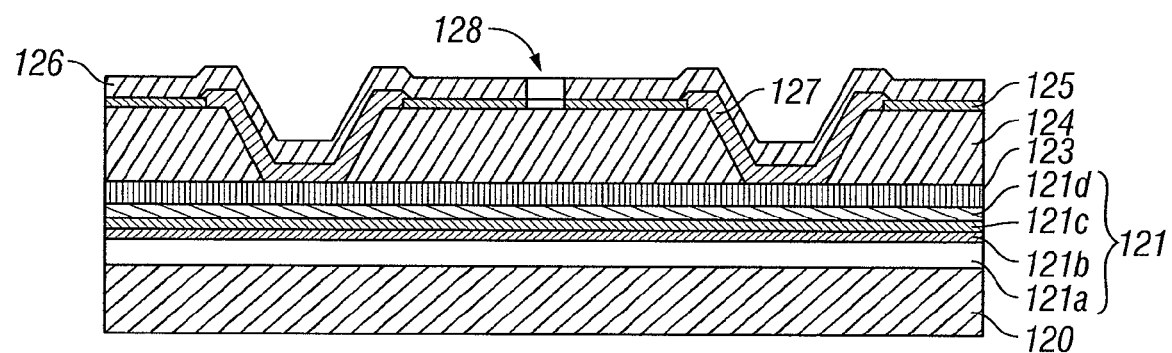

Then, a material for a deformable layer 126 is deposited over the posts 127 and the reflective layer 125, as shown in FIG. 12D. The material for the deformable layer 126 is preferably nickel. Then, the nickel and aluminum layers 125 and 126 are patterned and etched to define arrays of MEMS devices and provide through-holes 128 in the movable electrode layers. The holes 128 serve to permit etchant to enter and etch byproduct to exit at a release step which will be later described. In addition, the holes 128 provide an exit for air when the reflective layer moves between the relaxed and actuated positions. FIG. 12D illustrates a cross-section of a completed "unreleased" interferometric modulator structure with the sacrificial layer in place.

In an unpictured embodiment, another sacrificial layer is deposited over the aluminum reflective layer after patterning the reflective layer and before patterning the sacrificial layer. Then, the sacrificial layers are patterned to provide recesses for support posts, and the support posts are formed. Subsequently, a deformable layer is formed over the second sacrificial layer and the support posts. This process provides a deformable layer from which the reflective layer can be suspended, as described above with reference to FIGS. 7C-7E.

Figure 12E:
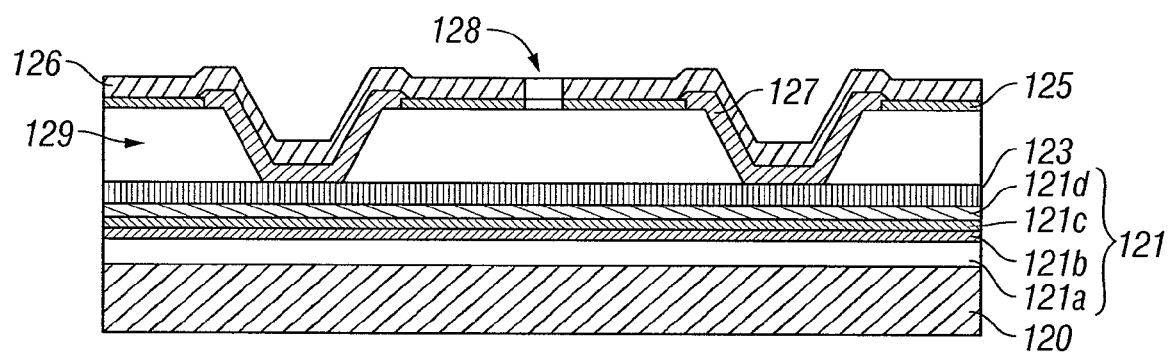

Finally, the sacrificial layer 124 is selectively removed, leaving a cavity or gap 129 between the reflective layer 125 and the porous layer 123, as shown in FIG. 12E. This step is referred to as a "release" or "sacrificial etch" step. The illustrated sacrificial layer 124 which is formed of molybdenum is preferably etched using a fluorine-based etchant, for example, a XeF$_2$-based etchant, which selectively etches molybdenum without attacking other exposed materials (SiO$_2$, Al$_2$O$_3$, Al, etc.) that define the cavity 129. A resulting "released" MEMS device, particularly interferometric modulator, is shown in FIG. 12E. Although not illustrated, a skilled artisan will appreciate that different steps may be performed to form electrode structures having options such as tethered or suspended movable electrode, as shown in FIGS. 7B-7E.

FIGS. 13A-13L illustrate a method of making the interferometric modulator of FIG. 11 according to another embodiment. In the method, a porous surface is formed on a reflective layer 132 surface facing a fixed electrode.

Figure 13A:
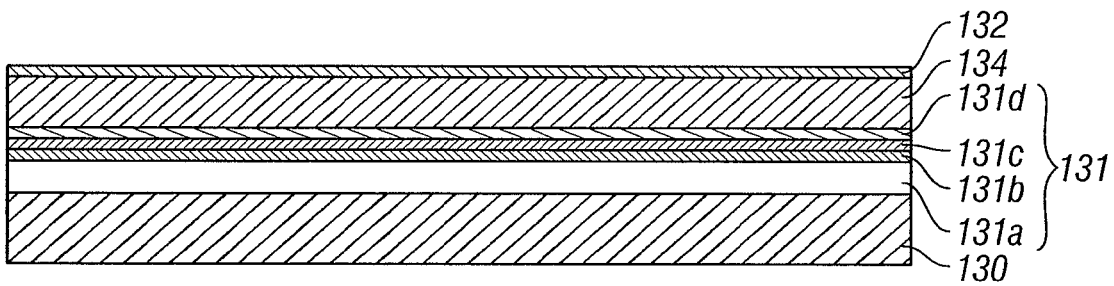
FIGS. 13A-13L are schematic cross sections illustrating a method of forming the interferometric modulator of FIG. 11 according to another embodiment.

In FIG. 13A, an optical stack is provided over a transparent substrate 130. In the illustrated embodiment, the optical stack 131 has a transparent conductor in the form of an ITO layer 131a overlying the substrate 130, a metallic layer 131b overlying the ITO layer 131a, a first dielectric layer 131c overlying the metallic layer 131b, and a second dielectric layer 131d overlying the first dielectric layer 131c. The metallic layer 131b is preferably formed of chromium. In another embodiment for a broad-band white interferometric modulator, the metallic layer 131b may be replaced with a semiconductor layer. The semiconductor layer is preferably formed of germanium. The first dielectric layer 131c may be formed of silicon dioxide. The second dielectric layer 131d may be formed of aluminum oxide and may serve as an etch stop layer. The layers 131a-131d may have a thickness as described above with respect to the layers 16c-16f of FIG. 11. In certain embodiments, the optical stack may have only one dielectric layer or none, depending on materials and selectivity of a release etch which will be described later.

Subsequently, a sacrificial layer 134 is provided over the second dielectric layer 131d, as shown in FIG. 13A. In the illustrated embodiment, the sacrificial layer 134 is formed of molybdenum. Other examples of sacrificial materials include silicon and tungsten. A thickness of the sacrificial layer 134 is equal to a size of a relaxed MEMS device cavity. It also determines color displayed by the MEMS device during operation. Next, an aluminum layer 132 is deposited on the sacrificial layer 134. The aluminum layer 132 preferably has a thickness of between about 30 Å and about 1,000 Å.

Figure 13B:
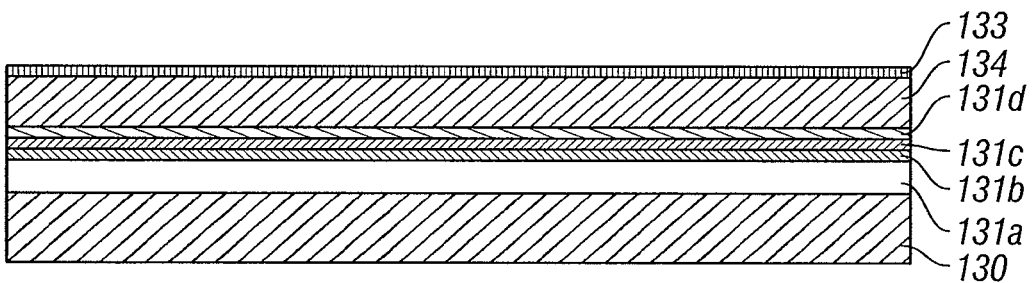
Figure 13C:
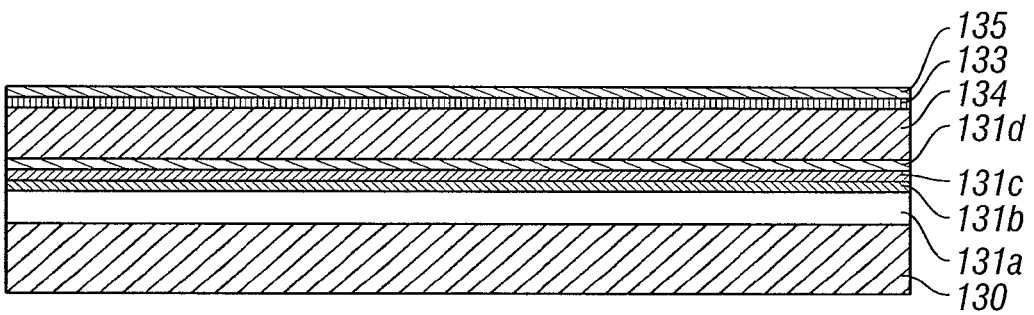

Next, as shown in FIG. 13B, the aluminum layer 132 is anodized to form a porous aluminum oxide layer 133. As in the anodizing step described above with reference to FIG. 12, desired pore spacing and pore diameter may be obtained by selecting an appropriate anodizing voltage and an anodizing electrolyte. In the illustrated embodiment, the anodizing voltage is preferably between about 5 V and about 300 V. In addition, the anodizing electrolyte may be selected from sulfuric, phosphoric, oxalic, chromic, and citric acid. In the illustrated embodiment, a concentration of the anodizing electrolyte is preferably between about 0.1 M and about 1 M. The anodizing step is preferably performed for about 10 min. and about 100 min. at a temperature between about 0° C. and about 40° C.

Resulting pores have a diameter between about 50 Å and about 3,000 Å. In addition, after the anodizing step, the porous aluminum oxide layer 133 becomes about 1.5 times thicker than the aluminum layer 132. In the illustrated embodiment, the porous layer 133 has a thickness between about 50 Å and about 1,500 Å. In the embodiment, the aluminum layer 132 has been fully transformed into the porous aluminum oxide layer 133. The pores of the porous layer 133 have been etched completely down to the sacrificial layer 134.

Next, steps for forming a movable electrode and support posts are performed. A reflective layer 135 is first deposited over the porous layer 133, as shown in FIG. 13C. The reflective layer 135 is preferably formed of Al, Au, Ag, or an alloy of the foregoing. In certain embodiments where the MEMS device is used as an electromechanical capacitive switch, the layer 135 may be formed of a conductor such as Cu, Pt, Ni, Au, Al, or an alloy of the foregoing. In the illustrated optical MEMS embodiment, the reflective layer 135 is formed of aluminum (Al). Because the pore diameter and thickness of the porous layer 133 have been chosen to avoid full penetration of an aluminum layer 135 through the pores down to the sacrificial layer 134, there remain some air cavities at the bottom surface of the anodized layer 133.

Figure 13D:
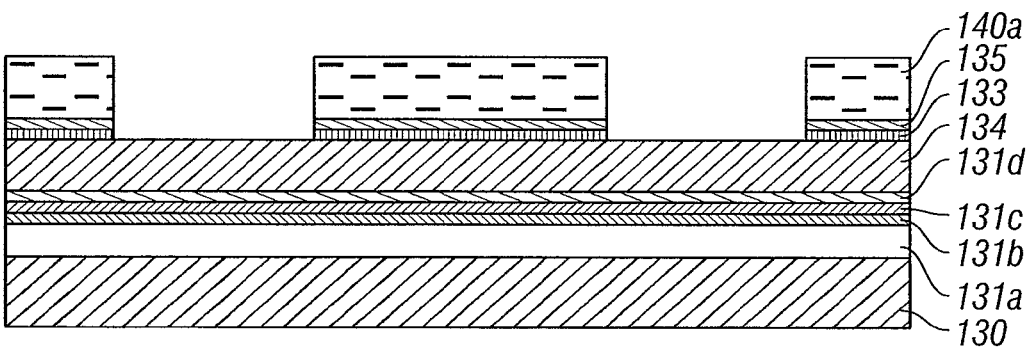
Figure 13E:
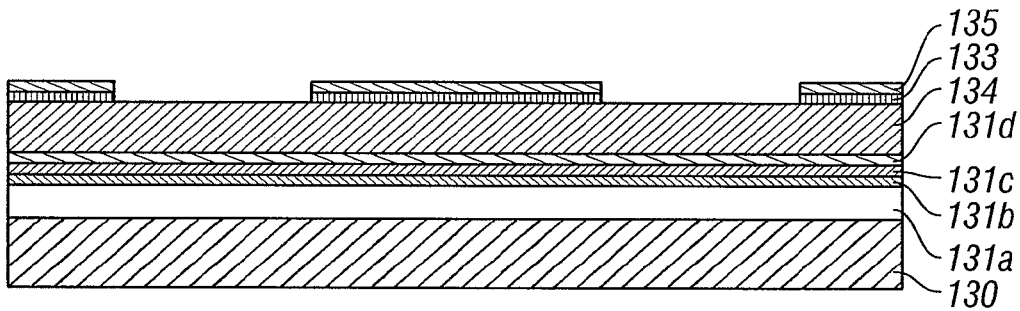

The reflective layer 135 and the porous layer 133 are then patterned using a lithographic process, preferably a photolithographic process. A photoresist 140a is provided over the reflective layer 135 and is patterned to provide a mask for etching the underlying reflective layer 135 and porous layer 133. Then, the porous and reflective layers 133 and 135 are etched through openings of the photoresist 140a, as shown in FIG. 13D. This etching step can be performed using any suitable etch process, including a dry or wet etch process. In certain embodiments, the etching step may include two etch processes for the reflective layer 135 and the porous layer 133, respectively, using the same mask. Then, the photoresist 140a is stripped, exposing portions of the sacrificial layer surface, as shown in FIG. 13E.

Figure 13F:
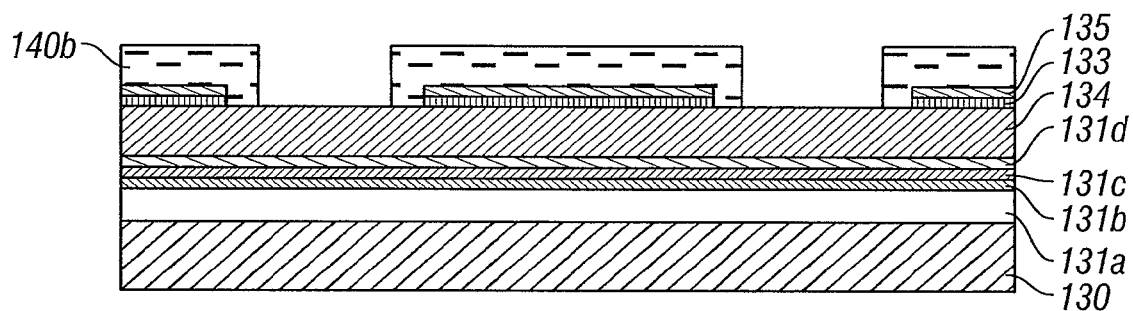
Figure 13G:
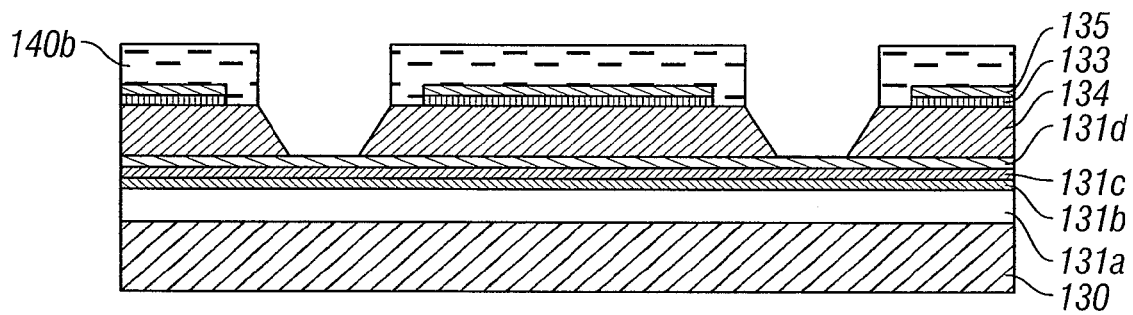
Figure 13H:
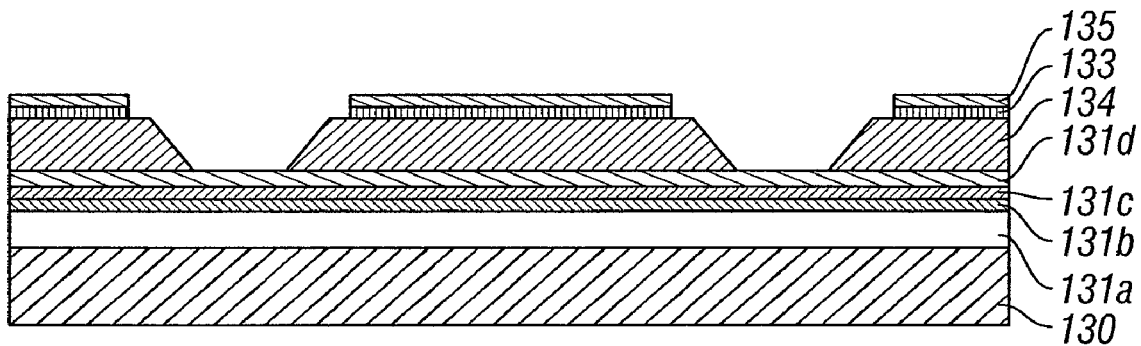

Subsequently, another photolithographic process is performed to pattern the sacrificial layer 134 for forming support posts. As illustrated in FIG. 13F, a photoresist 140b is provided and patterned over the sacrificial layer 134 and the reflective layer 135. Then, the sacrificial layer 134 is etched using a dry etch process, as shown in FIG. 13G, preferably using a fluorine-based etchant such as $SF_6/O_2$, $CF_4/O_2$, or $NF_3$, or a chlorine-based etchant such as $Cl_2/BCl_3$. The photoresist 140b is then stripped, as shown in FIG. 13H.

Figure 13I:
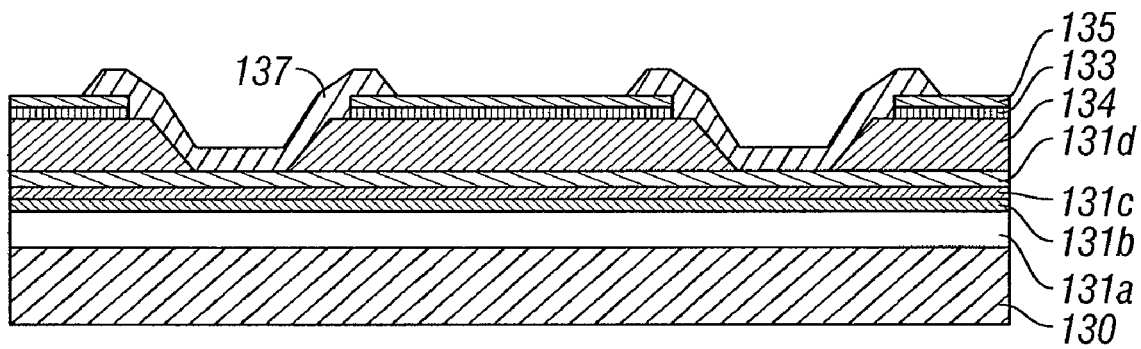

Then, a material for posts 137, preferably an inorganic dielectric material such as silicon dioxide, is deposited over exposed surfaces, including surfaces of the sacrificial layer 134 and the reflective layer 135. Subsequently, the silicon dioxide layer 137 is patterned to form posts, using a suitable etch process, including a wet or dry etch process. When a dry etch is used, the aluminum reflective layer 135 may serve as an etch stopper. A resulting layer structure is illustrated in FIG. 13I.

Figure 13J:
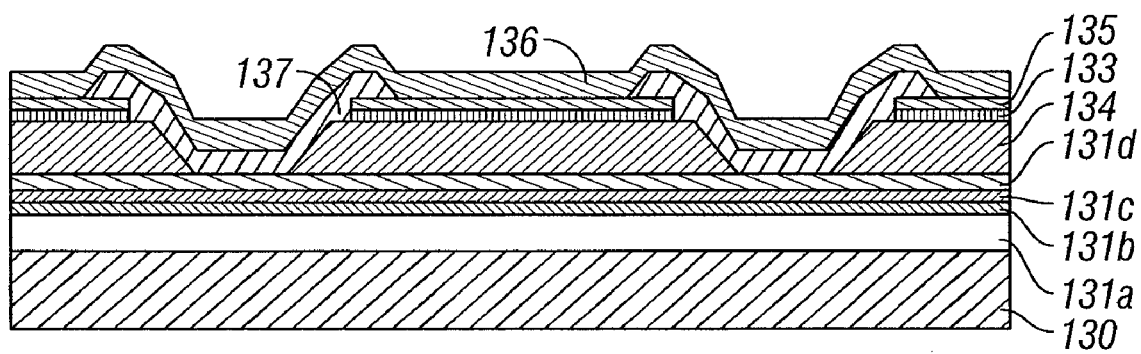
Figure 13K:
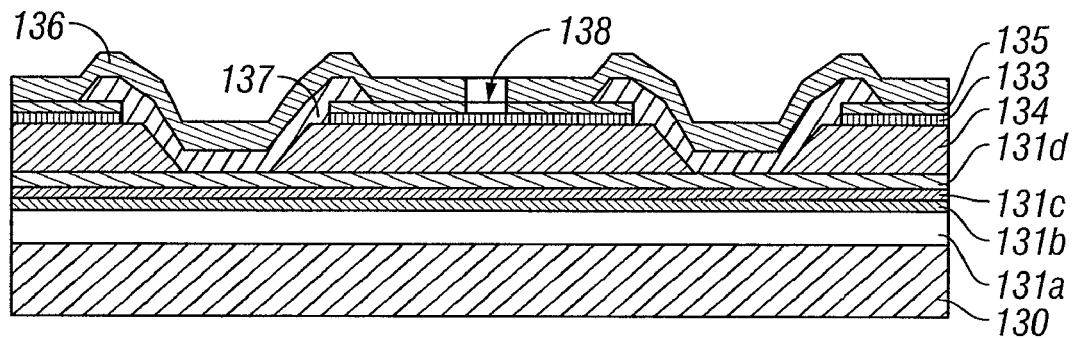

Next, a material for a mechanical or deformable layer 136 is deposited over the support posts 137 and the reflective layer 135 as shown in FIG. 13J. The material is preferably nickel. Then, the deformable layer 136, the reflective layer 135, and the porous layer 133 are etched to provide through-holes 138 in the middle, as shown in FIG. 13K. The etch process can be either a wet or dry etch process. The holes 138 serve to permit etchant to enter and etch byproduct to exit at a release step which will be later described. In addition, the holes 138 provide an exit for air when the reflective layer moves between the relaxed and actuated positions. FIG. 13K illustrates a cross-section of a completed "unreleased" interferometric modulator structure with the sacrificial layer in place.

In an unpictured embodiment, another sacrificial layer is deposited over the aluminum reflective layer after patterning the reflective layer and before patterning the sacrificial layer. Then, the sacrificial layers are patterned to provide recesses for support posts, and the support posts are formed. Subsequently, a deformable layer is formed over the second sacrificial layer and the support posts. This process provides a deformable layer from which the reflective layer can be suspended, as described above with reference to FIGS. 7C-7E. Although not illustrated, a skilled artisan will appreciate that different steps may be performed to form electrode structures having options such as a tethered movable electrode, as shown in FIG. 7B.

Figure 13L:
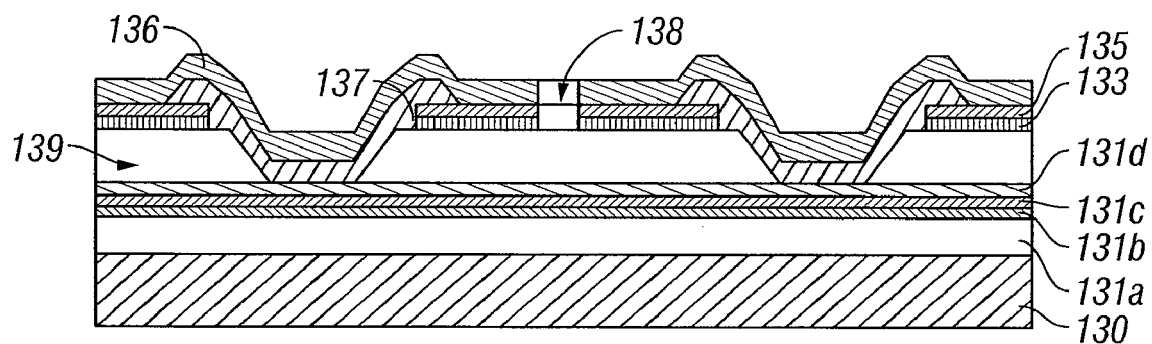

Finally, the sacrificial layer 134 is selectively removed, leaving a cavity or gap 139 between the dielectric layer 131d and the porous layer 133, as shown in FIG. 13L. The illustrated sacrificial layer 134 which is formed of molybdenum is preferably etched using a fluorine-based etchant such as a $XeF_2$-based etchant. A resulting MEMS device, particularly a released interferometric modulator, is shown in FIG. 13L.

In an unpictured embodiment, a partially anodized layer can be formed on a movable electrode. First, an optical stack is provided over a transparent substrate. The optical stack can have a layer structure and material as described above with respect to the optical stack of FIG. 13. Subsequently, a sacrificial layer, preferably formed of molybdenum, is provided over the optical stack. Next, a reflective layer, preferably formed of aluminum, is formed over the sacrificial layer. Then, the reflective layer and the sacrificial layer are patterned to provide recesses for support posts. Then, the support posts are formed in the recesses. Then, a material for a deformable layer is deposited over the support posts and the reflective layer. Then, the reflective and deformable layers are etched to provide through-holes in the middle. Next, the sacrificial layer is removed, leaving a cavity or gap between the reflective layer and the optical stack. Details of each step are as described above with reference to FIG. 12. After this step, the aluminum reflective layer is anodized through the hole and the cavity. At this anodizing step, the aluminum reflective layer is partially anodized from the lower surface up to a desired depth, leaving a layer of aluminum to serve as a reflective layer between the mechanical layer and the porous alumina.

In another unpictured embodiment, porous layers are formed prior to providing a sacrificial layer and after providing the sacrificial layer. A resulting interferometric modulator is configured to have a movable electrode and a fixed electrode, both of which have a porous layer. First, an optical stack is provided over a transparent substrate. The optical stack can have a layer structure and material as described above with respect to the optical stack of FIG. 13. Subsequently, an aluminum layer is provided over the optical stack and is anodized. Then, a sacrificial layer, preferably formed of molybdenum, is provided over the anodized alumina layer. Next, another aluminum layer is provided over the sacrificial layer and is anodized. Subsequently, a reflective layer, preferably formed of aluminum, is formed over the anodized alumina layer. Then, the reflective layer, the porous layer, and the sacrificial layer are patterned to provide recesses for support posts. Then, the support posts are formed in the recesses. Then, a material for a deformable layer is deposited over the support posts and the reflective layer. Then, the anodized layer, the reflective layer, and the deformable layer are patterned and etched. Next, the sacrificial layer is removed, leaving a cavity or gap between the two anodized alumina layers.

It should be noted that the embodiments described above are applicable to an interferometric modulator structure viewed from the opposite side, compared to that shown in FIG. 1. Such a configuration has a reflective electrode closer to the substrate (which need not be transparent) and a semi-transparent electrode farther from the substrate. Either or both electrodes could be made movable. In addition, although not shown, it should be noted that the embodiments of FIG. 8-13 may be combined with options of the embodiments described above with reference to FIGS. 1-7.

The above-described modifications can lead to a more robust design and fabrication. Additionally, while the above aspects have been described in terms of selected embodiments of the interferometric modulator, one of skill in the art will appreciate that many different embodiments of interferometric modulators may benefit from the above aspects. Of course, as will be appreciated by one of skill in the art, additional alternative embodiments of the interferometric modulator can also be employed. The various layers of interferometric modulators can be made from a wide variety of conductive and non-conductive materials that are generally well known in the art of semi-conductor and electro-mechanical device fabrication.

In addition, the embodiments, although described with respect to an interferometric modulator, are applicable more generally to other MEMS devices, particularly electrostatic MEMS with electrodes capable of relative movement, and can prevent stiction in an actuated or collapsed position.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

The invention claimed is:

1. A microelectromechanical systems (MEMS) device, comprising:
   a first electrode having a first surface; and
   a second electrode having a second surface facing the first surface, the second electrode movable in a gap between a first position and a second position, the first position being a first distance from the first electrode, the second position being a second distance from the first electrode, the second distance being greater than the first distance,
   wherein at least one of the electrodes comprises a porous layer having a porous surface facing the other of the electrodes, and wherein the porous surface is substantially continuous while including a plurality of pores formed therethrough.

2. The MEMS device of claim 1, wherein the MEMS device serves as an interferometric modulator.

3. A display system, comprising:
   the MEMS device of claim 2;
   a display;
   a processor that is in electrical communication with the display, the processor being configured to process image data; and
   a memory device in electrical communication with the processor.

4. The display system of claim 3, further comprising:
   a first controller configured to send at least one signal to the display; and
   a second controller configured to send at least a portion of the image data to the first controller.

5. The MEMS device of claim 1, wherein the porous layer comprises an anodized layer.

6. The MEMS device of claim 1, wherein the porous layer comprises $Al_2O_3$.

7. The MEMS device of claim 1, wherein the porous layer has a hexagonal array structure.

8. The MEMS device of claim 1, wherein the first electrode comprises the porous layer.

9. The MEMS device of claim 1, wherein the second electrode comprises the porous layer.

10. The MEMS device of claim 9, wherein the second electrode comprises an aluminum reflective layer, and wherein the porous layer is formed directly on the reflective layer such that the porous layer faces the first electrode.

11. The MEMS device of claim 9, further comprising a sacrificial layer between the first electrode and the porous layer.

12. The MEMS device of claim 1, wherein the porous surface has pores having an average diameter between about 50 Å and about 3,000 Å.

13. The MEMS device of claim 1, wherein the porous layer has a pore density of between about $10^{12}$ m$^{-2}$ and about $10^{15}$ m$^{-2}$.

14. The MEMS device of claim 1, wherein the porous layer has a thickness of between about 30 Å and about 1,500 Å.

15. The MEMS device of claim 1, wherein the at least one of the electrodes further comprises an aluminum layer, and wherein the porous layer comprises anodized porous alumina formed directly on the aluminum layer.

16. The MEMS device of claim 15, wherein the aluminum layer has a thickness of between about 30 Å and about 50 Å.

17. The MEMS device of claim 15, wherein the aluminum layer has a reflectance of between about 33% and 37%.

18. The MEMS device of claim 1, wherein the first electrode comprises an indium tin oxide (ITO) layer.

19. The MEMS device of claim 18, wherein the first electrode further comprises a chromium layer between the ITO layer and the porous layer.

20. The MEMS device of claim 19, wherein the first electrode further comprises a dielectric layer between the chromium layer and the porous layer.

21. The MEMS device of claim 20, wherein the dielectric layer comprises at least one selected from the group consisting of silicon dioxide and aluminum oxide.

22. The MEMS device of claim 21, wherein the dielectric layer comprises a silicon dioxide layer and an aluminum oxide layer stacked over each other, and wherein the aluminum oxide layer is interposed between the porous layer and the silicon dioxide layer.

23. The MEMS device of claim 1, further comprising a deformable layer, wherein the second electrode is suspended from the deformable layer.

24. An interferometric modulator, comprising:
  transmissive means for at least partially transmitting incident light, the transmissive means having a first surface;
  reflective means for substantially reflecting incident light, the reflective means having a second surface facing the first surface; and
  moving means for moving the reflective means relative to the transmissive means between a driven position and an undriven position, the driven position being closer to the transmissive means than is the undriven position,
  wherein at least one of the transmissive and reflective means comprises a porous surface facing the other of the transmissive and reflective means, and wherein the porous surface is substantially continuous while including a plurality of pores formed therethrough.

25. The interferometric modulator of claim 24, wherein the means for moving comprises a deformable layer.

26. The interferometric modulator of claim 24, wherein the transmissive means comprises a transparent conductive layer.

27. The interferometric modulator of claim 26, wherein the transmissive means further comprises an absorber layer.

28. The interferometric modulator of claim 24, wherein the reflective means comprises a reflective layer.

29. The interferometric modulator of claim 24, wherein the porous surface is defined by an anodized layer.

30. The interferometric modulator of claim 24, wherein the porous surface is defined by a layer comprising $Al_2O_3$.

31. The interferometric modulator of claim 24, wherein the porous surface has a hexagonal array structure.

32. The interferometric modulator of claim 24, wherein the porous surface has pores having an average diameter between about 50 Å and about 3,000 Å.

33. The interferometric modulator of claim 24, wherein the porous surface has a pore density of between about $10^{12} m^{-2}$ and about $10^{15} m^{-2}$.

34. The interferometric modulator of claim 24, wherein the transmissive means comprises the porous surface.

35. The interferometric modulator of claim 24, wherein the reflective means comprises the porous surface.

* * * * *